(12) United States Patent
Shiode

(10) Patent No.: US 7,468,798 B2
(45) Date of Patent: Dec. 23, 2008

(54) SYSTEM AND METHOD FOR POLARIZATION CHARACTERISTIC MEASUREMENT OF OPTICAL SYSTEMS VIA CENTROID ANALYSIS

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 11/627,153

(22) Filed: Jan. 25, 2007

(65) Prior Publication Data

US 2007/0171427 A1    Jul. 26, 2007

(30) Foreign Application Priority Data

Jan. 26, 2006    (JP)    .............. 2006-017561

(51) Int. Cl.
G01B 9/02    (2006.01)
G01B 11/02    (2006.01)

(52) U.S. Cl. .................... 356/495; 356/515

(58) Field of Classification Search ........... 356/495, 356/511, 512, 515
See application file for complete search history.

(56) References Cited

U.S. PATENT DOCUMENTS

| | | | | |
|---|---|---|---|---|
| 6,310,679 B1 * | 10/2001 | Shiraishi | ............... | 355/53 |
| 6,404,482 B1 * | 6/2002 | Shiraishi | ............... | 355/53 |
| 6,856,345 B1 | 2/2005 | Yamamoto et al. | | |
| 6,862,377 B2 * | 3/2005 | Szafraniec et al. | ............ | 385/11 |
| 7,126,757 B2 | 10/2006 | Mori | | |
| 7,277,182 B2 | 10/2007 | Wegmann et al. | | |
| 2003/0086071 A1 * | 5/2003 | McGuire | ............... | 355/71 |
| 2003/0086156 A1 * | 5/2003 | McGuire | ............... | 359/352 |
| 2003/0086157 A1 * | 5/2003 | McGuire | ............... | 359/352 |
| 2003/0086171 A1 * | 5/2003 | McGuire | ............... | 359/497 |
| 2003/0099047 A1 * | 5/2003 | Hoffman et al. | ............ | 359/754 |
| 2003/0128349 A1 | 7/2003 | Unno | | |
| 2004/0008348 A1 | 1/2004 | Kishikawa et al. | | |
| 2004/0114150 A1 | 6/2004 | Wegmann et al. | | |
| 2004/0263814 A1 | 12/2004 | Unno | | |
| 2007/0171427 A1 * | 7/2007 | Shiode | ............... | 356/495 |

FOREIGN PATENT DOCUMENTS

| | | |
|---|---|---|
| CN | 1405633 A | 3/2003 |
| EP | 1 818 658 | 8/2007 |
| JP | 11-054411 | 2/1999 |

(Continued)

OTHER PUBLICATIONS

Y. Unno, Influence of birefringence on the image formation of high-resolution projection optics, Applied Optics, Jul. 1, 2000, pp. 3243-3252, vol. 39, No. 19.

(Continued)

*Primary Examiner*—Patrick J Connolly
(74) *Attorney, Agent, or Firm*—Morgan & Finnegan LLP

(57) ABSTRACT

A method for irradiating onto a target optical system plural linearly polarized rays having different polarization directions, and for measuring a polarization characteristic of the target optical system including a birefringence amount R and a fast axis Φ includes the steps of irradiating linearly polarized ray having a polarization direction θ onto the target optical system and obtaining a centroid amount P of the ray that has transmitted through the target optical system, and obtaining the birefringence amount R and the fast axis Φ from $P=-R\cdot\cos(2\theta-\Phi)$ or $P=R\cdot\cos(2\theta-\Phi)$.

9 Claims, 28 Drawing Sheets

FOREIGN PATENT DOCUMENTS

JP    2004-061515    2/2004

OTHER PUBLICATIONS

Ebihara et al: "Novel metrology methods for image quality control", Microelectric Engineering, Elsevier Publishers BV., Amsterdam, NL, vol. 83, No. 4-9, Jan. 19, 2006, pp. 634-639.

Shiode et al: "Study of polarization aberration measurement using SPIN method", PROC SPIE INT SOC OPT ENG; Proceeding of SPIE—The International Society for Optical Engineering; Optical Microlithography XIX 2006, vol. 6154 III, 2006; pp. 615431-1 -615431-9.

Communication from EPO dated Nov. 5, 2007 including European Search Report dated Oct. 16, 2007.

Chinese Office Action concerning Appln 200710004730.9 dated Sep. 5, 2008 and English Translation.

* cited by examiner

SYSTEM AND METHOD FOR POLARIZATION CHARACTERISTIC MEASUREMENT OF OPTICAL SYSTEMS VIA CENTROID ANALYSIS

BACKGROUND OF THE INVENTION

The present invention relates to a measurement method of a polarization characteristic, an exposure apparatus, and a device manufacturing method.

A projection exposure apparatus has been conventionally used to manufacture fine semiconductor devices with the photolithography technology. The projection exposure apparatus transfers a pattern of a reticle or mask to a substrate, such as a wafer, via a projection optical system. Since this exposure apparatus is required to precisely transfer a reticle pattern to a substrate at a predetermined magnification, it is important to use a projection optical system having a good imaging characteristic. In addition, a polarization illumination is also used to improve the imaging characteristic. Consequently, a precise measurement of the polarization characteristic of the projection optical system, such as a birefringence amount, a fast axis, and a Jones matrix, is increasingly demanded. In addition, a simplified measurement is important to enhance the productivity and the economic efficiency.

The birefringence is usually calculated by measuring a phase difference after the light transmits through a sample with a predetermined thickness, and normalizing it with the sample's thickness. This amount is referred to as a "birefringence amount" or "retardance." In addition to the retardance, it is also important to obtain a fast axis and Jones matrix of the projection optical system.

The Senarmont method, which is a typical measurement method of the retardance, determines the ellipticity and ellipse's major axis, and calculates the retardance through an elliptical polarization analysis by combining a ¼ retardation sheet with a polarizer, and converting the elliptically polarized light that has transmitted through the sample back to the linearly polarized light. A method that calculates the retardance from the light intensity, such as a rotational analyzer (polarizer) and a phaser method, also utilizes a ¼ retardation sheet and a polarizer. The optical heterodyne interferometry uses a ½ retardation sheet and a polarizer to calculate the retardance.

Prior art include, for example, Japanese Patent Applications, Publication Nos. 2004-61515 and 11-054411, and Yasuyuki Unno "Influence Of Birefringence On The Image Formation Of High-Resolution Projection Optics," 1 Jul. 2000, Vol. 39, No. 19, APPLIED OPTICS (simply referred to as "Unno" hereinafter).

Thus, the prior art use such optical elements as the ½ or ¼ retardation sheet, polarizer, and analyzer to measure the retardance in the polarization analysis. Thus, an incorporation of these optical elements into an originally complicated system would increase the cost and design load.

SUMMARY OF THE INVENTION

The present invention is directed to a method for measuring the polarization characteristic of the target optical system in a simpler manner than ever with no optical element, such as a retardation sheet and a polarizer.

A method according to one aspect of the present invention for irradiating onto a target optical system plural linearly polarized rays having different polarization directions, and for measuring a polarization characteristic of the target optical system including a birefringence amount R and a fast axis Φ includes the steps of irradiating linearly polarized ray having a polarization direction θ onto the target optical system and obtaining a centroid amount P of the ray that has transmitted through the target optical system, and obtaining the birefringence amount R and the fast axis Φ from P=−R·cos(2θ−Φ) or P=R·cos(2θ−Φ).

A further object and other characteristics of the present invention will be made clear by the preferred embodiments described below referring to accompanying drawings.

BRIEF DESCRIPTION OF THE DRAWINGS

FIG. 3A is directed to a theoretical value, and FIG. 3B is directed to a result of an approximation according to this embodiment.

FIG. 4A is directed to a theoretical value, and FIG. 4B is a result of an approximation according to this embodiment.

DESCRIPTION OF THE EMBODIMENTS

Figure 1:
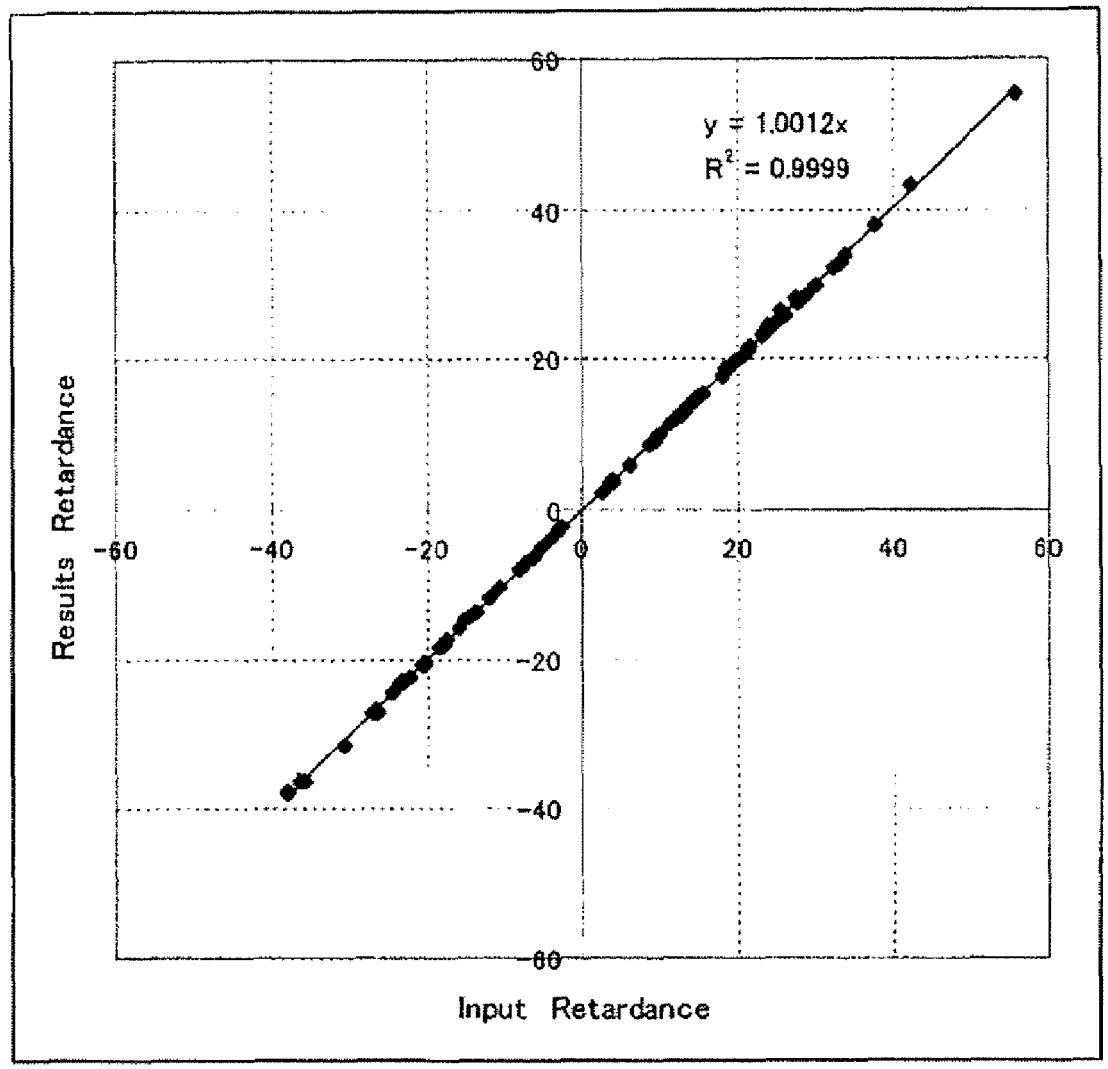
FIG. 1 is a graph showing that an actual value of the retardance and a value of the retardance obtained as a result of that a phase difference between a pair of orthogonal elements of the eigenvector (characteristic vector) of the Jones matrix is approximated to nπ are proportional.

This embodiment evaluates optical information, and analyses a polarization characteristic of a target optical system through approximation. The optical information is obtained without optically extracting observation light for each polarized light in a specific polarization direction through an optical element. The observation light is obtained by irradiating onto the target optical system plural rays having different polarization states. The optical information is a phase difference or a centroid (center-of-gravity) amount P of the light generated by weighing phases of two rays with their light intensities when the two rays are divided by the birefringence. The polarization characteristic is calculated from the optical information through approximation. The centroid amount will be described in detail later.

A lens having an ideal transmittance of 100% is expressed by a diagonal unitary matrix. When the matrix is multiplied between a matrix Rot($\theta$) and a matrix Rot($-\theta$), which provide its principal axis with a rotation, one ideal lens can be expressed by a Jones matrix. The Jones matrix is a convenient matrix generally used to calculate the polarization. The operation can be simplified when the light is expressed as the polarized light or the Jones vector (as 2×1 matrix when the polarization is described in the usual XY plane), and a sample or optical element is expressed the polarized light or as a 2×2 matrix.

Turning back to the previous determinant, the Rot matrix is also unitary and thus a product between them is unitary. Next, the Jones matrix of the entire projection optical system in an exposure apparatus will be discussed. The projection optical system of the exposure apparatus includes plural lenses. Therefore, the Jones matrix can be expressed as shown by Equation 1 by multiplying the Jones matrix for each lens by the number of lenses or the number of lens planes, where R is retardance, $\theta$ is an angle between the principal axis and an incident polarization direction, and j is a lens number:

$$M' = \Pi \mathrm{Rot}(-\theta_j) \cdot [\exp(-iR_j/2), 0; 0\ \exp(iR_j/2)] \cdot \mathrm{Rot}(\theta_j) \quad \text{EQUATION 1}$$

Equation 1 describes the 2×2 matrix as [(1, 1), (1, 2); (2, 1), (2, 2)]. Clearly, the Jones matrix M' is a unitary matrix (see Unno above).

An actual lens has a slightly lowered transmittance, and the transmittance of the entire projection optical system lowers by several percentages to dozens of percentages depending upon a wavelength and a glass material. It is therefore conceivable that the Jones matrix of the actual projection optical system is expressed by Equation 2, and is a non-unitary matrix, where A and A' are real numbers or transmittances:

$$M'' = \Pi \mathrm{Rot}(-\theta_j) \cdot [A_j \cdot \exp(-iR_j/2), 0; 0, A_j' \cdot \exp(iR_j/2)] \cdot \mathrm{Rot}(\theta_j) \quad \text{EQUATION 2}$$

Yet the projection optical system still has such a high transmittance and restrained birefringence amount that the projection optical system is as close as the ideal lens. The characteristic of the Jones matrix M" in Equation 2 can be considered to still possess unitarity. Indeed, as a result of an analysis of M", M" has two eigenvectors having approximately equal lengths, and they are not conjugate but orthogonal. The analysis solved an eigenvalue problem in Equation 3:

$$M \cdot X = X \cdot L \quad \text{EQUATION 3}$$

From Equation 3, two vectors or elements of the eigenvector are made orthogonal. Accordingly, it is assumed that directions of two eigenvectors shift by $\pi$ in the complex coordinate system:

$$X = [Ex, Ey \cdot \exp(i \cdot (\pi + \xi)); Ey \cdot \exp(i \cdot \xi), Ex] \quad \text{EQUATION 4}$$

$$L = [A \cdot \exp(-i \cdot R), 0; 0, A' \cdot \exp(i \cdot R)] \quad \text{EQUATION 5}$$

$$M = X \cdot L \cdot inv(X) \quad \text{EQUATION 6}$$

$$Ex^2 + Ey^2 = 1 \quad \text{EQUATION 7}$$

$$\mathrm{Det}(X) \approx 1 \quad \text{EQUATION 8}$$

Equation 8 is met under condition of $\xi = n\pi$ (n is an integer), which will be described later. The condition of $\xi = n\pi$ (n is an integer) is equivalent to an approximation of the eigenvector of the Jones matrix of the target optical system to the linearly polarized light.

M is a Jones matrix of a target optical system, X is an eigenvector, L is a characteristic value, A and A' are real numbers, and Ex and Ey are elements of a unit vector (real number), and $\xi$ is a phase difference between Ex and Ey.

When the linearly polarized light is incident upon the target optical system S at an azimuth $\theta$, light E' that has transmitted through the target optical system S is expressed by Equation 9 below:

$$E' = M \cdot [\cos \theta; \sin \theta] \quad \text{EQUATION 9}$$

Since elements Ex and Ey of two eigenvectors X have the same size as A≈A', Equation 9 is as Equation 10:

$$E' = A \cdot [Ex^2 \cdot \exp(-i \cdot R) + Ey^2 \cdot \exp(i \cdot (2\xi + R)), 2Ex \cdot Ey \cdot \sin R \cdot \exp(i \cdot (\xi + \pi/2)); 2Ex \cdot Ey \cdot \sin R \cdot \exp(i \cdot (\xi + \pi/2)), Ex^2 \cdot \exp(i \cdot R) + Ey^2 \cdot \exp(i \cdot (2\xi - R))] \cdot [\cos \theta; \sin \theta] \quad \text{EQUATION 10}$$

When Equation 10 is rewritten with Equation 11, Equations 12 and 13 are obtained:

$$E'=[Ex'; Ey']$$ EQUATION 11

$$1/A \cdot Ex'=(Ex^2 \cdot \exp(-i \cdot R)+Ey^2 \cdot \exp(i \cdot (2\xi+R)))\cos\theta-(2Ex \cdot Ey \cdot \sin R \cdot \exp(i \cdot (\xi+\pi/2)))\sin\theta$$ EQUATION 12

$$1/A \cdot Ey'=(Ex^2 \cdot \exp(i \cdot R)+Ey^2 \cdot \exp(i \cdot (2\xi-R)))\sin\theta-(2Ex \cdot Ey \cdot \sin R \cdot \exp(i \cdot (\xi+\pi/2)))\cos\theta$$ EQUATION 13

Here, Equations 14 and 15 are assumed:

$$\mathrm{Tan}(Px)=\mathrm{imaginary}(Ex')/\mathrm{real}(Ex')$$ EQUATION 14

$$\mathrm{Tan}(Py)=\mathrm{imaginary}(Ey')/\mathrm{real}(Ey')$$ EQUATION 15

Then, Equation 14 becomes as follows:

$$\mathrm{Tan}(Px)=\{(-Ex^2 \cdot \sin R+Ey^2 \cdot \sin(2\xi+R))\cos\theta-2Ex \cdot Ey \cdot \sin R \cdot \sin(\xi+\pi/2) \cdot \sin\theta\}/\{(Ex^2 \cdot \cos R+Ey^2 \cdot \cos(2\xi+R))\cos\theta-2Ex \cdot Ey \cdot \sin R \cdot \cos(\xi+\pi/2) \cdot \sin\theta\}=\{\sin R \cdot (-Ex^2+Ey^2 \cdot \cos(2\xi)) \cdot \cos\theta-2Ey^2 \cdot \cos R \cdot \sin(\xi) \cdot \cos(\xi) \cdot \cos\theta-2Ex \cdot Ey \sin R \cdot \cos(\xi) \cdot \sin\theta\}/\{\cos R \cdot (Ex^2+Ey^2 \cdot \cos(2\xi)) \cdot \cos\theta+2Ey^2 \cdot \sin R \cdot \sin(\xi) \cdot \cos(\xi) \cdot \cos\theta+2Ex \cdot Ey \cdot \sin R \cdot \sin(\xi) \cdot \sin\theta\}$$ EQUATION 16

Figure 27:
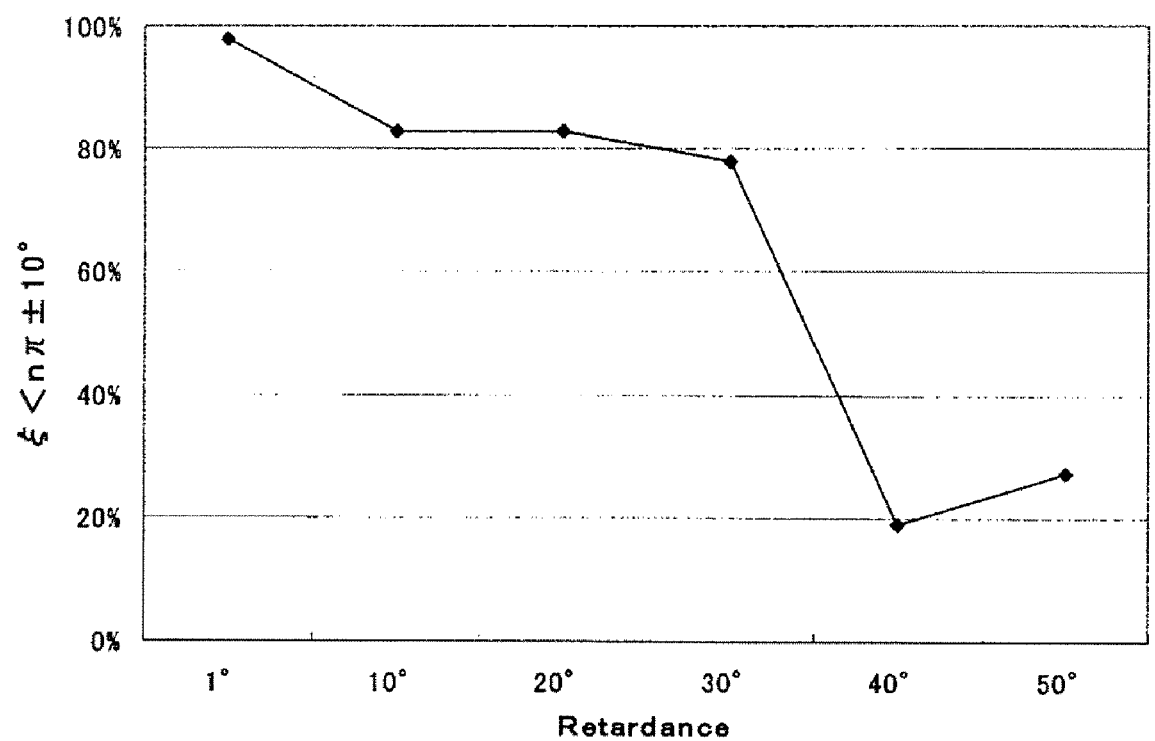
FIG. 27 is a graph showing that a phase difference between a pair of orthogonal elements of the eigenvector in the Jones matrix can be approximated to $n\pi$ when the birefringence amount is small.

The unitarity is now inspected, where an ideal lens having a non-deteriorated transmittance is assumed, and the birefringent amount of one optical element is uniformly distributed at angles of 1°, 10°, 20°, 30°, 40°, and 50°, respectively. The principal axis of each optical element is uniformly distributed in a $2\pi$ range. The Jones matrix of whole thirty optical elements is calculated under this condition, the previous Jones matrix is solved as an eigenvalue problem. The eigenvector is calculated, and $\xi$ is also inspected. FIG. 27 shows a result.

The ordinate axis denotes a ratio of $\xi$ smaller than $n\Pi \pm 10°$, and the abscissa axis denotes a distribution range of the birefringent amount. As illustrated, $\xi$ converges to $n\Pi$ (n is an integer) in such a small distribution range of the birefringent amount as within 30°). Outside 30°, $\xi$ can suddenly have values outside $n\Pi \pm 10°$. The projection optical system is manufactured while its birefringent amount is minimized so that its value is 1° to 2° per lens. A value of $\xi$ can be regarded as $n\Pi$ as in Equation 17:

$$\xi \approx n\Pi$$ EQUATION 17

From Equation 17, Equation 16 becomes as follows:

$$\mathrm{Tan}(Px) \approx \{\sin R \cdot (-Ex^2+Ey^2) \cdot \cos\theta-2Ex \cdot Ey \cdot \sin R \cdot \cos(\xi) \cdot \sin\theta\}/\cos R \cdot (Ex^2+Ey^2) \cdot \cos\theta=\mathrm{Tan} R \cdot \{-S2 \cdot \cos\theta-S3 \cdot \sin\theta\}/\cos\theta$$ EQUATION 18

$$Px \approx R \cdot \{-S2 \cdot \cos\theta-S3 \cdot \sin\theta\}/\cos\theta$$ EQUATION 19

Similarly, Equation 20 below is met:

$$Py \approx R \cdot \{S2 \cdot \sin\theta-S3 \cdot \cos\theta\}/\sin\theta$$ EQUATION 20

Also, the following equations are established:

$$S2=Ex^2-Ey^2$$ EQUATION 21

$$S3=2Ex \cdot Ey \cdot \cos(\xi)$$ EQUATION 22

$$\mathrm{Tan}(Px), \mathrm{Tan}(Py) \approx Px, Py$$ EQUATION 23

Px and Py are respectively phase changes of the x-polarized light and y-polarized light that have transmitted through the target optical system S. The conventional polarization measurement uses a polarizer to extract the x-polarized light and the y-polarized light. However, it is difficult to incorporate the optical element, such as a polarizer, into the system, and thus the conventional aberration measurement system would measure a sum of Px and Py. When the light intensities of the x-polarized light and the y-polarized light are the same, the measured value can be considered to be simply an average value of Px and Py. However, when the x-polarized light and the y-polarized light do not have the same light intensity, it is conceivable to measure the following centroid or center of gravity of the light, where P is a centroid amount, Ix is the light intensity of the x-polarized light, and Iy is the light intensity of the y-polarized light:

$$P=(Px \cdot Ix+Py \cdot Iy)/(Ix+Iy)$$ EQUATION 24

Then, the following equation is met.

$$Ix=Ex' \cdot Ex'^*=A^2 \cdot \{\cos^2\theta+(2Ex \cdot Ey \cdot \sin R \cdot \sin\theta)\} \approx A^2 \cdot \cos^2\theta$$ EQUATION 25

Similarly, the following equation is established:

$$Iy \approx A^2 \cdot \sin^2\theta$$ EQUATION 26

Then, the following equation is established.

$$P=R \cdot \{-S2 \cdot \cos\theta-S3 \cdot \sin\theta\}/\cos\theta \cdot \cos^2\theta+R \cdot \{S2 \cdot \sin\theta-S3 \cdot \cos\theta\}/\sin\theta \cdot \sin^2\theta=R \cdot \{-S2 \cdot \cos\theta-S3 \cdot \sin\theta\} \cdot \cos\theta+R \cdot \{S2 \cdot \sin\theta-S3 \cdot \cos\theta\} \cdot \sin\theta=R \cdot \{S2 \cdot (\sin^2\theta-\cos^2\theta)-2 \cdot S3 \cdot \sin\theta\cos\theta\}=R \cdot \{-S3 \cdot \sin(2\theta)-S2 \cdot \cos(2\theta)\}$$ EQUATION 27

Now, Equations 28 and 29 are assumed. Then, Equation 27 is as Equation 30.

$$S2=k \cdot \cos\Phi$$ EQUATION 28

$$S3=k \cdot \sin\Phi$$ EQUATION 29

$$P=-R \cdot k \cdot \cos(2\theta-\Phi)$$ EQUATION 30

$\Phi$ can be regarded as a fast axis of the target optical system S calculated from eigenvector X from Equation 31:

$$S3/S2=\tan\Phi$$ EQUATION 31

When the eigenvector X is expressed by Stokes parameter with respect to k, the following equations are met:

$$Ex^2+Ey^2=1$$ EQUATION 32

$$Ex^2-Ey^2=k\cos\Phi$$ EQUATION 33

$$2Ex \cdot Ey \cdot \cos(\xi)=k\sin\Phi$$ EQUATION 34

Here, k is a constant. When (Ex, Ey) is expressed in a polar coordinate system, Equation 34 is converted as follows:

$$\cos(2\theta)=k \cdot \cos\Phi$$ EQUATION 35

$$\sin(2\theta)=k \cdot \sin\Phi/\cos(\xi)$$ EQUATION 36

Thus, the following equations are met:

$$(k \cdot \cos\Phi)^2+(k \cdot \sin\Phi/\cos(\xi))^2=1$$ EQUATION 37

$$k=\cos(\xi)/\mathrm{sqrt}(\cos^2(\xi) \cdot \cos^2\Phi+\sin^2\Phi)$$ EQUATION 38

From Equation 17, $k \approx \pm 1$ is met (although k=1 when n is an even number, and k=−1 when n is an odd number), and Equation 30 becomes Equation 39:

$$P=-R \cdot \cos(2\theta-\Phi) \text{ when } n \text{ is an even number, and}$$
$$P=R \cdot \cos(2\theta-\Phi) \text{ when } n \text{ is an odd number.}$$ EQUATION 39

From Equation 39, the measurement system that can measure the centroid amount P of the light irradiates plural linearly polarized rays having different azimuths $\theta$ onto the target optical system S, and performs a fast Fourier transform ("FFT") analysis for many measured amounts P. This analysis can provide through approximation the retardance R and the fast axis $\Phi$ of the target optical system S having an eigenvector that suffices an equation of $\xi=n\pi$.

A description will now be given of a method for approximating the Jones matrix of the target optical system S:

$$M=[A \cdot \exp(-i \cdot m), a \cdot \exp(-i \cdot b); a \cdot \exp(-i \cdot b), A' \cdot \exp(i \cdot m)]$$ EQUATION 40

From Equations 9 and 40, the following equations are met:

$$a \approx 2A''\cdot\sin R\cdot Ex\cdot Ey \text{(although } a, A''>0, A''=(A+A')/2) \quad \text{EQUATION 41}$$

$$b \approx \xi+\pi/2 \quad \text{EQUATION 42}$$

From Equation 17, Equation 43 is met:

$$b \approx \pm\pi/2 \quad \text{EQUATION 43}$$

When the transmittances A and A' are measured, m is calculated from the following equation:

$$m \approx Arg\{A\cdot Ey^2\cdot\exp(-i\cdot R)+A'\cdot Ex^2\cdot\exp(i\cdot R)\} \quad \text{EQUATION 44}$$

When the above results are substituted for Equation 40, the Jones matrix M of the target optical system S can be approximated:

This embodiment is verified under the following condition: In Equation 2, the birefringent amount of one optical element is uniformly distributed in a range of 5°, and similarly the principal axis of each optical element is uniformly distributed within a range of 2π. The transmittance A is also uniformly distributed in a range of 0.985±0.005 for each optical element. The transmittance A' is fixed to 1. Under this condition, the Jones matrix of the entire target optical system that includes thirty optical elements is calculated, and the previous Jones matrix is solved as an eigenvalue problem so as to obtain the eigenvector and the characteristic value. Next, the retardance and the fast axis are obtained as theoretical values. The calculation uses a commercially available Matlab calculation software library.

Figure 2:
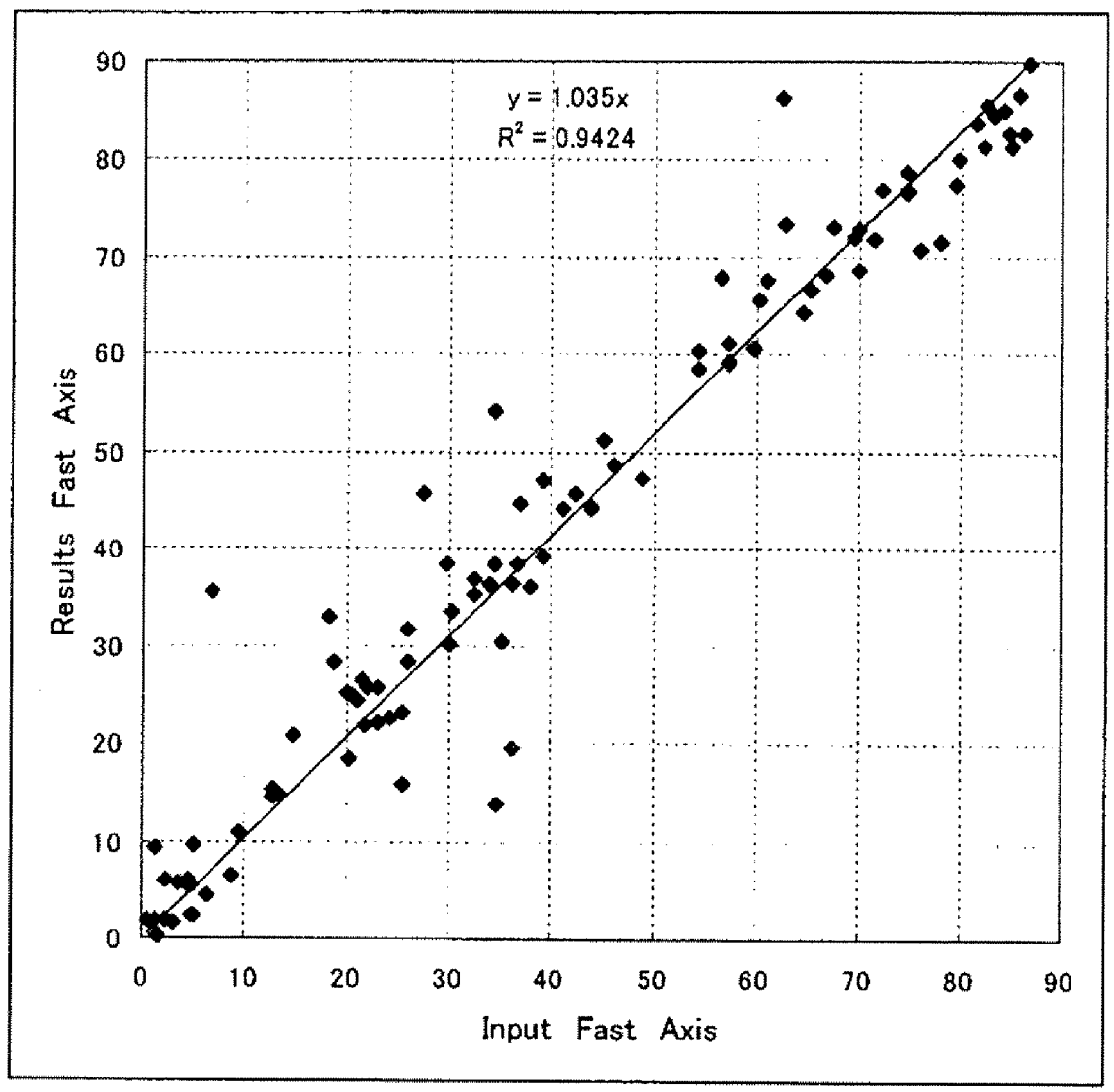
FIG. 2 is a graph showing that an actual value of the fast axis and a value of the fast axis obtained as a result of that a phase difference between a pair of orthogonal elements of the eigenvector of the Jones matrix is approximated to nπ are proportional.

According to the method of this embodiment, the retardance and the fast axis are calculated through the least squares method or the FFT analysis by providing the Jones matrix with illuminations of linearly polarized rays having different polarization directions between 0° and 180° at intervals of 10° and by calculating the centroid of the transmitting light. FIGS. 1 and 2 are correlation diagrams of the resultant retardance and fast axis obtained from these two results for the Jones matrixes for 100 samples.

FIG. 1 shows that there is a proportion between an actual value of the retardance and a value of the retardance obtained as a result of that a phase difference between a pair of orthogonal elements of the eigenvector in the Jones matrix is approximated to nπ. FIG. 2 is a graph showing that there is a proportion between an actual value of the fast axis and a value of the fast axis obtained as a result of that a phase difference between a pair of orthogonal elements of the eigenvector in the Jones matrix is approximated to nπ.

From FIG. 1, the retardance is measured with no problem. Data scatters a little in the result of the fast axis in FIG. 2. Those points that greatly shift from the approximated line have small retardance amounts. From this, the measurement accuracy of the fast axis is considered proportional to a magnitude of the retardance amount. This means that in the exposure apparatus, a precise measurement of a fast axis is needed for a large retardance amount that needs an aberrational adjustment, but a small retardance amount does not need an adjustment. Thus, as long as the retardance amount is properly measured, there is little substantial problem.

Figure 3B:
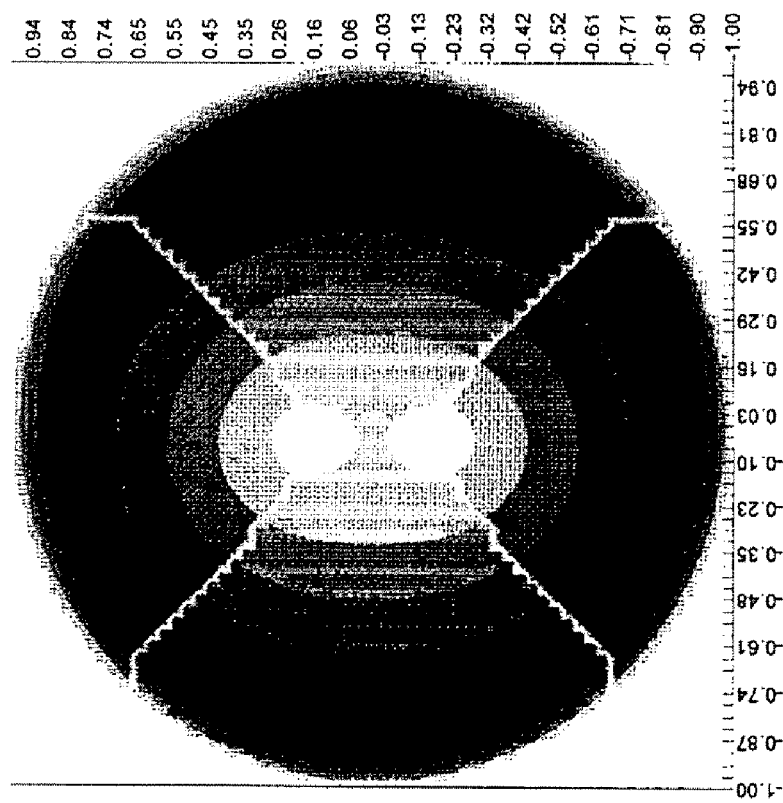
FIGS. 3A and 3B show retardance distributions in the pupil of the projection optical system. More particularly.
Figure 3A:
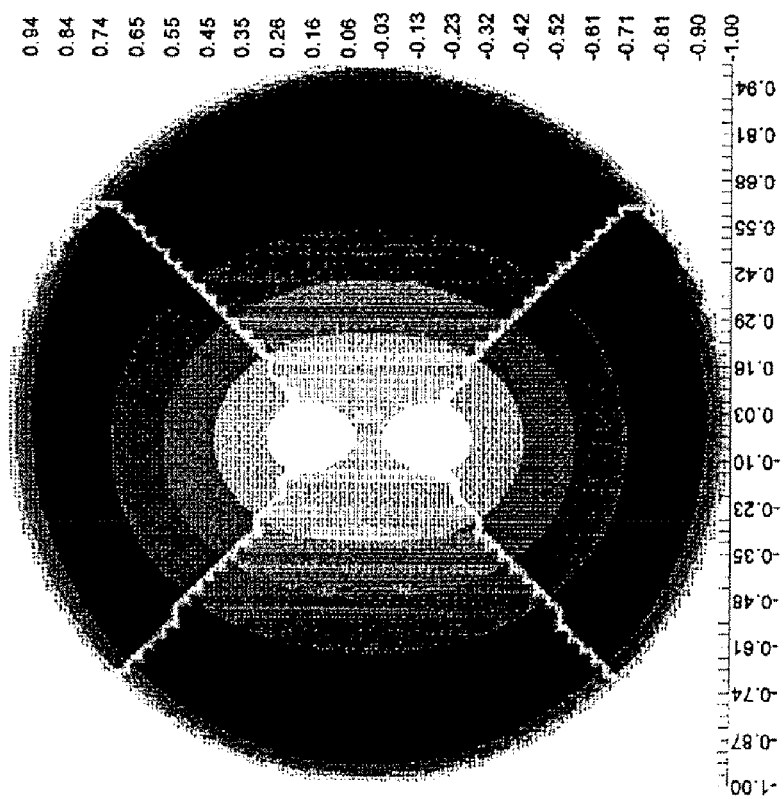
Figure 4A:
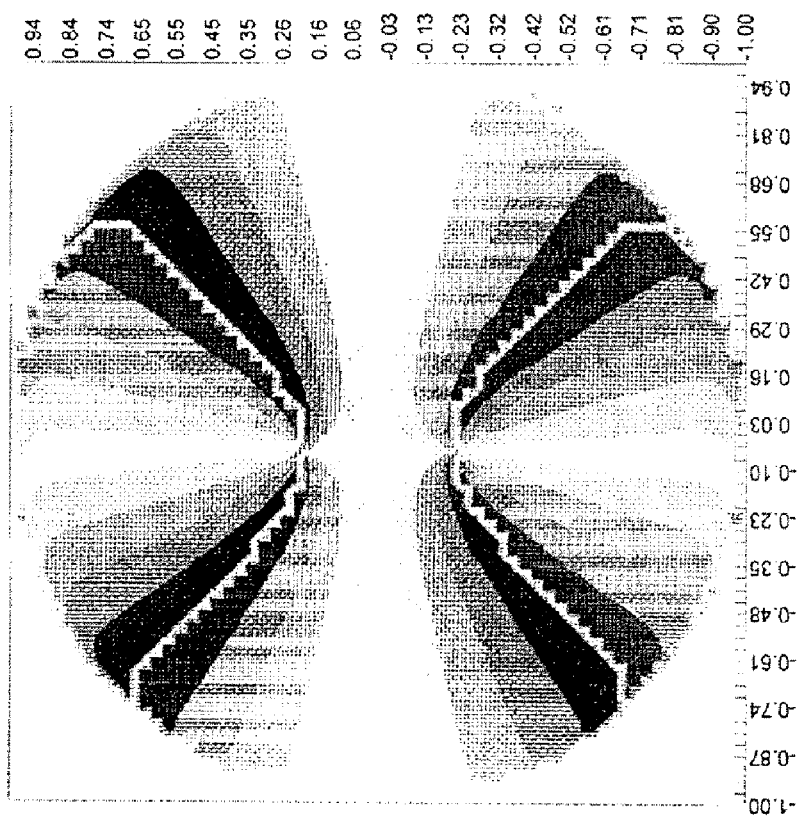
FIGS. 4A and 4B show fast-axis distributions in the pupil of the projection optical system. More particularly.
Figure 4B:
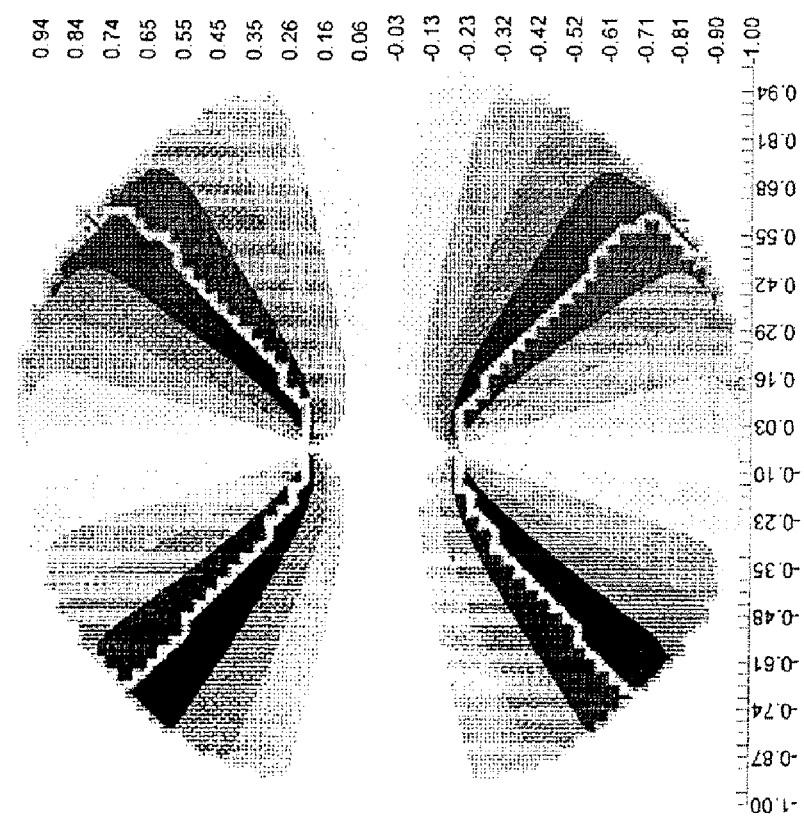

Another inspection example calculates for the pupil position in the projection optical system. FIGS. 3A to 4B show the results. The utilized samples are a 63×63 Jones matrix in the pupil, which is designed to actually evaluate an exposure apparatus. FIGS. 3A and 3B are maps that color-code the retardance amount that distributes in the pupil of the projection optical system. FIG. 3A shows theoretical values, and FIG. 3B shows a result obtained by an approximate measurement method of this embodiment. Similarly, FIGS. 4A and 4B are maps that color-code the fast axis that distributes in the pupil of the projection optical system. FIG. 4A shows theoretical values, and FIG. 4B shows a result obtained by an approximate measurement method of this embodiment. It is understood from this result that the polarization analysis of this embodiment is sufficiently applicable to the optical system measurement of the exposure apparatus.

The centroid amount P of the light can be measured with a phase difference measurement method, such as a point diffraction interferometry ("PDI") and a lateral shearing interferometry ("LSI"), and a lateral shift measurement method, such as a Hartmann method.

Figure 5:
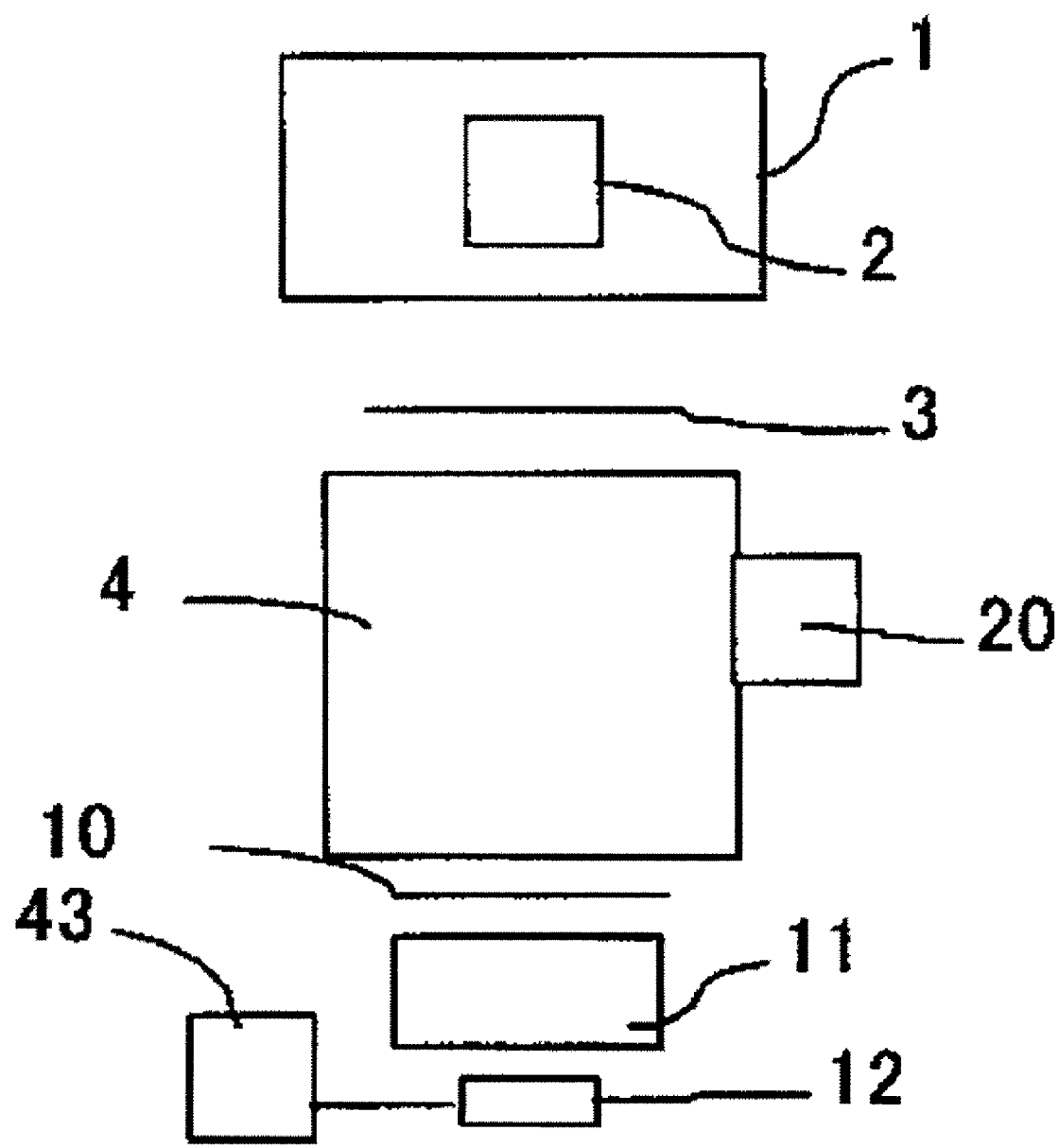
FIG. 5 is a schematic block diagram of an exposure apparatus that calculates a centroid amount of the light using the point diffraction interferometry ("PDI").
Figure 6:
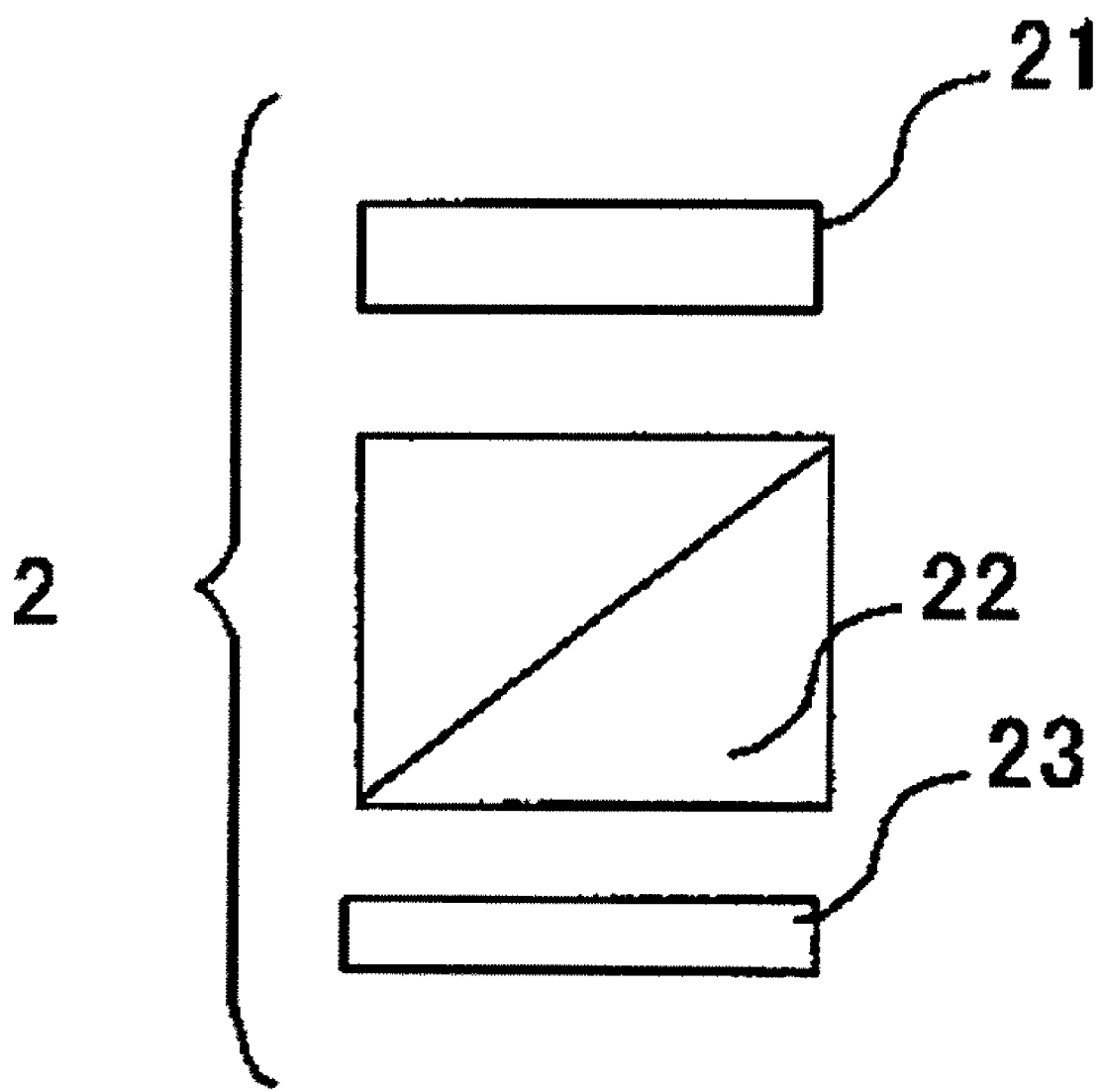
FIG. 6 is a schematic block diagram showing a structure of a polarization unit shown in FIG. 5.

Referring now to FIG. 5, a description will be given of a measurement method for the exposure apparatus that includes a PDI measurement system. An illumination optical system 1 having a polarization illumination unit 2 irradiates the light at an angle of a polarization direction of 0° onto a plate 3 that has one or more pinholes or line openings. FIG. 6 shows the details of the polarization illumination unit 2. The light that is diffused by a diffusion element 21 passes a rotatable retardation sheet similar to a rotatable polarizer 22 and forms an arbitrary polarization state that has an NA greater than that of a projection optical system 4. It is well-known from the exact solution led from the Maxwell equations that the opening of the plate 3 that is as small as a wavelength would vary a polarization state. Accordingly, a size and sectional shape of the opening of the plate 3 and a film material used for the opening need to be designed so as to maintain the illumination polarization state. The light that has passed the opening of the plate 3 becomes ideal spherical wave, passes the projection optical system 4, and then passes a plate 10 that has one or more pinholes or line openings under the influence of the wavefront of the projection optical system 4. This configuration divides the light into two rays and these two rays forms an interference pattern on a detection system 12 that is located at a position approximately conjugate with the pupil in the projection optical system 4 through a relay optical system 11. In addition, the relay optical system 11 may be omitted if the detection system 12 is located at a position that can be regarded as a far field. When the polarization direction of the illumination is rotated to repeat a measurement of an interference pattern, and a processing system 43 performs the above inventive FFT analysis and polarization analysis for values of an obtained interference pattern and polarization direction.

Figure 7:
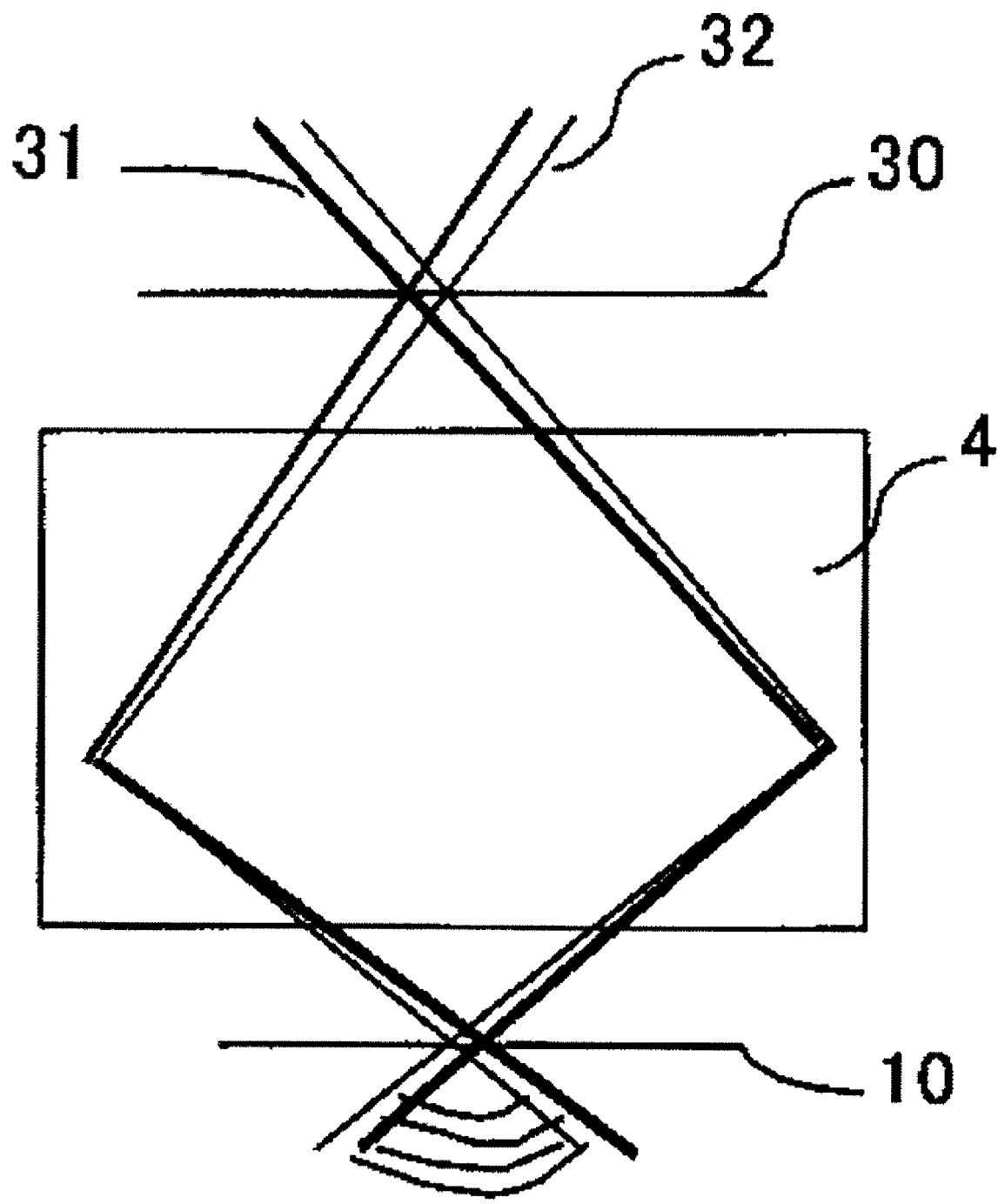
FIG. 7 is a schematic block diagram for explaining the PDI.
Figure 9:
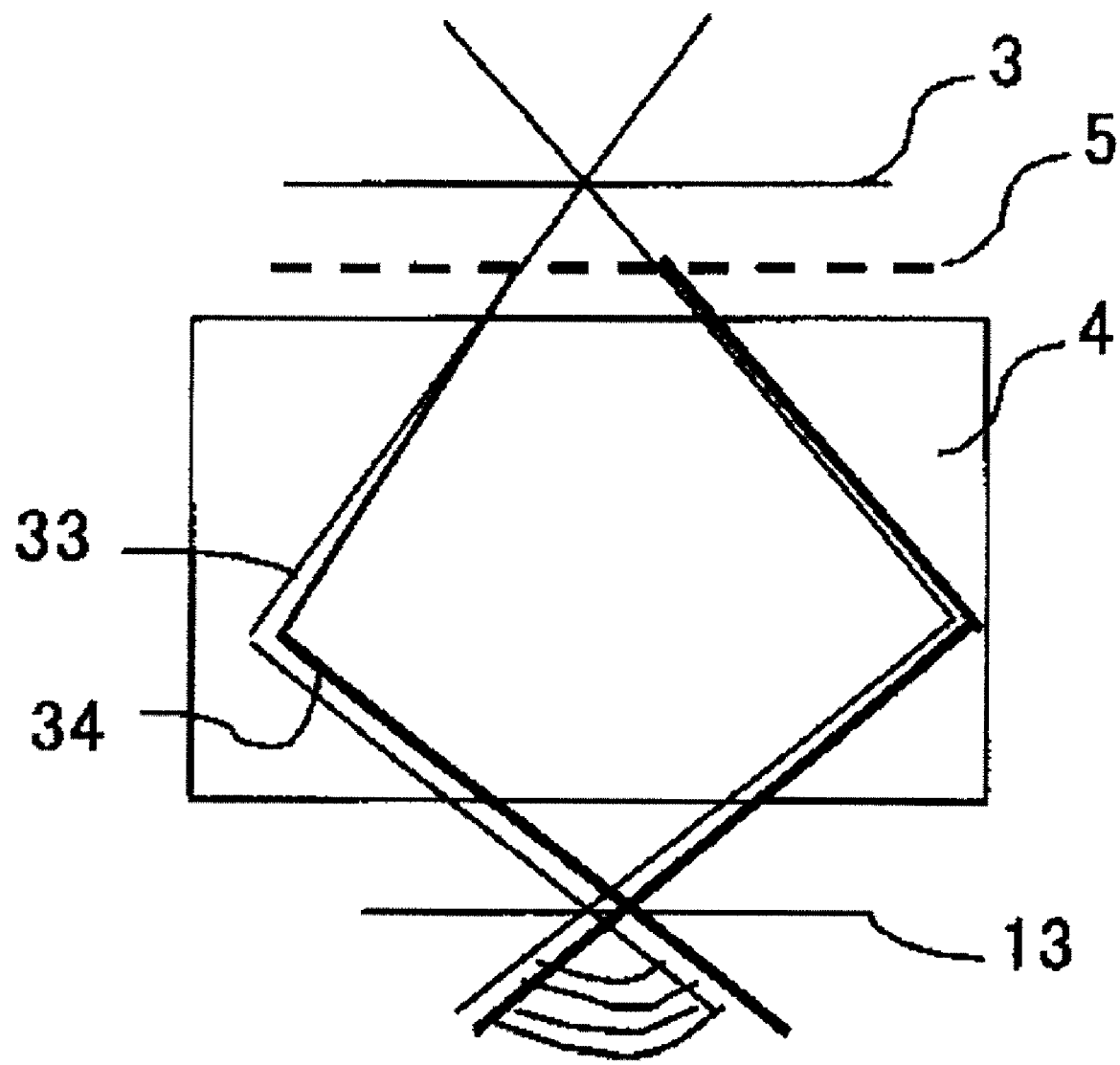
FIG. 9 is a schematic block diagram for explaining the PDI of the exposure apparatus shown in FIG. 8.

The PDI can adopt configurations shown in FIGS. 7 and 9. FIG. 7 shows a plate 30 having a pair of pinholes or line openings with different sizes. Rays 31 and 32 that have passed them pass the projection optical system 4 and then the plate 10 having a pair of pinholes or line openings with different sizes. The pinholes or line openings of the plates 30 and 10 are designed so that the rays 31 and 32 have the same intensity after passing through the plate 10. The rays 31 and 32 hold equal wavefront information of the projection optical system 4.

Figure 8:
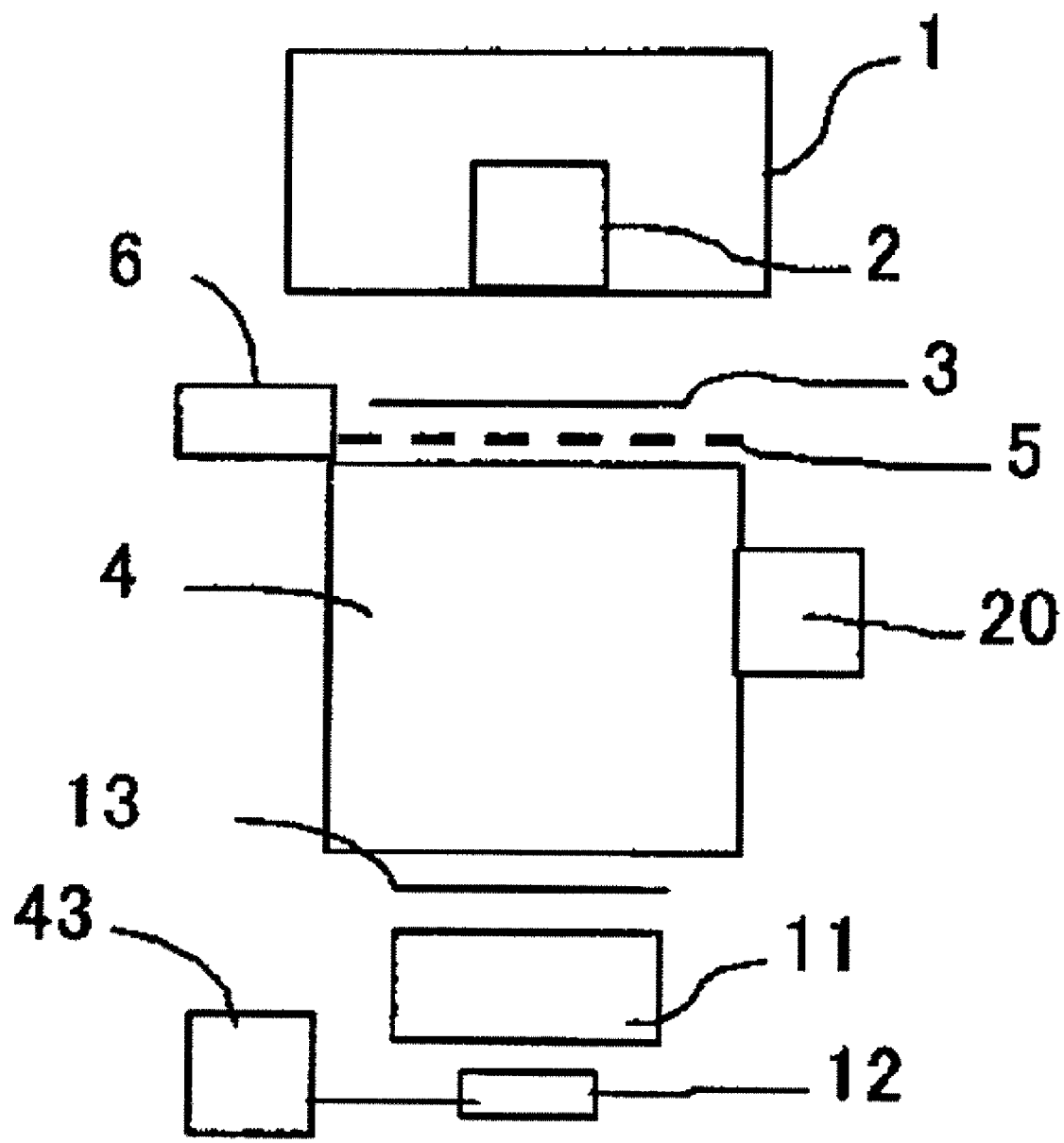
FIG. 8 is a schematic block diagram of a variation of an exposure apparatus shown in FIG. 5.

One ray passes a smaller opening in the plate 10, and serves as a spherical or cylindrical wavefront (reference wavefront) having no phase information. The other ray passes a larger opening, and holds the phase information. These rays interfere with each other. FIG. 9 is similar. The light that passes one opening in the plate 3 is divided into rays 33 and 34 by a diffraction grating 5, and these rays interfere with each other due to the openings in a plate 13 having different sizes corresponding to the openings in the plate 3 and the diffraction grating 5. FIG. 8 is a structure of the exposure apparatus shown in FIG. 9. Similar to the openings in the plate 3, the openings in the plates 10, 30 and 13 need to be designed so as to maintain the polarization state.

In the PDI measurement method, each point of the interference pattern formed on the detection system 12 contains a sum of the phase information of the x-polarized light and the phase information of the y-polarized light. In addition, whether the polarized ray is a phase wave or a reference wave, both polarized rays are equally subject to the influence of the projection optical system 4, and thus their light intensities hold the information in the interference. Therefore, the interference pattern has the information of the centroid of the light, and the measurement method of this embodiment is applicable to the exposure apparatus having the PDI measurement system.

Figure 10:
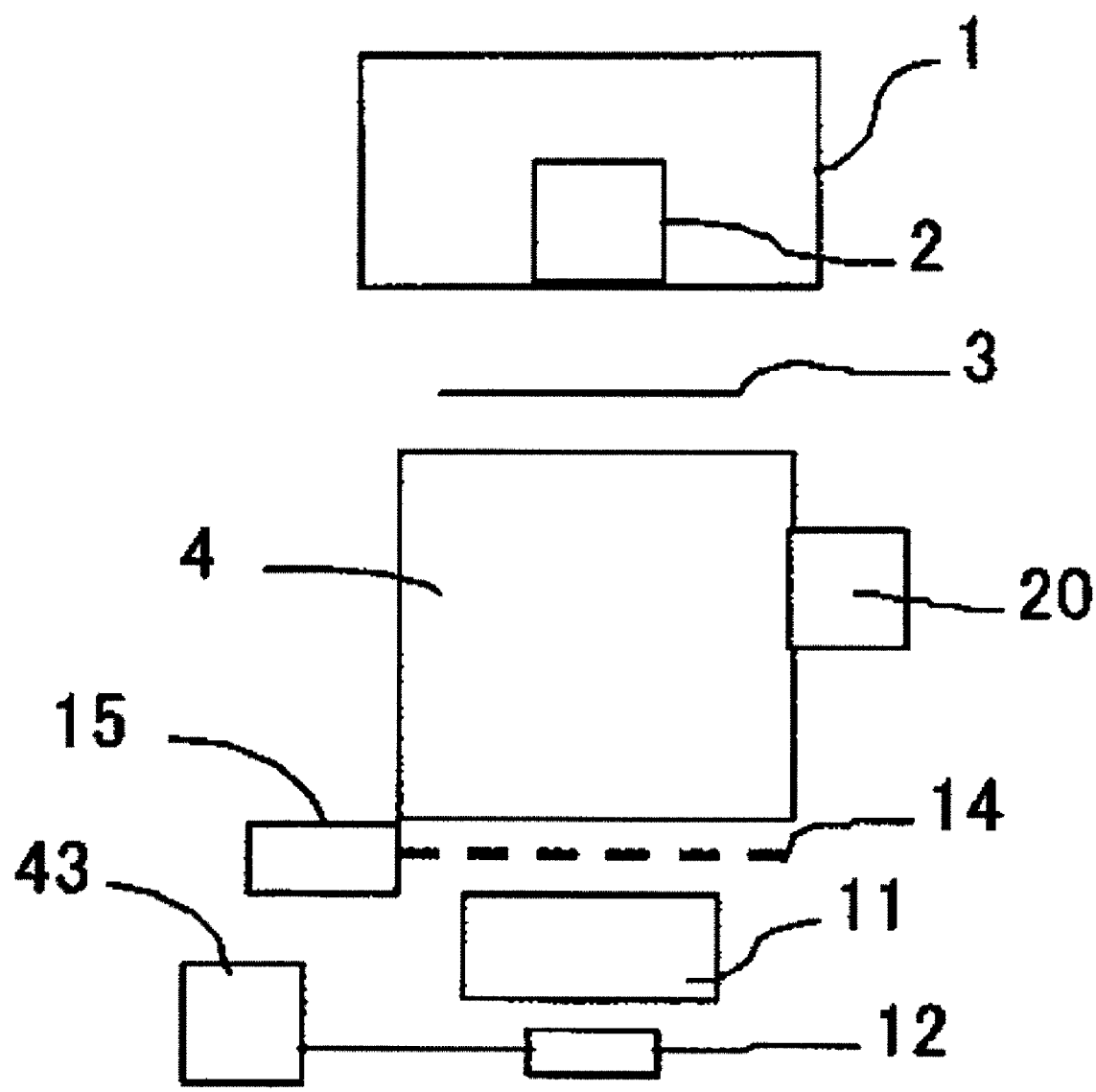
FIG. 10 is a schematic block diagram of the exposure apparatus that calculates the centroid amount of the light using the lateral sharing interferometry ("LSI").
Figure 11:
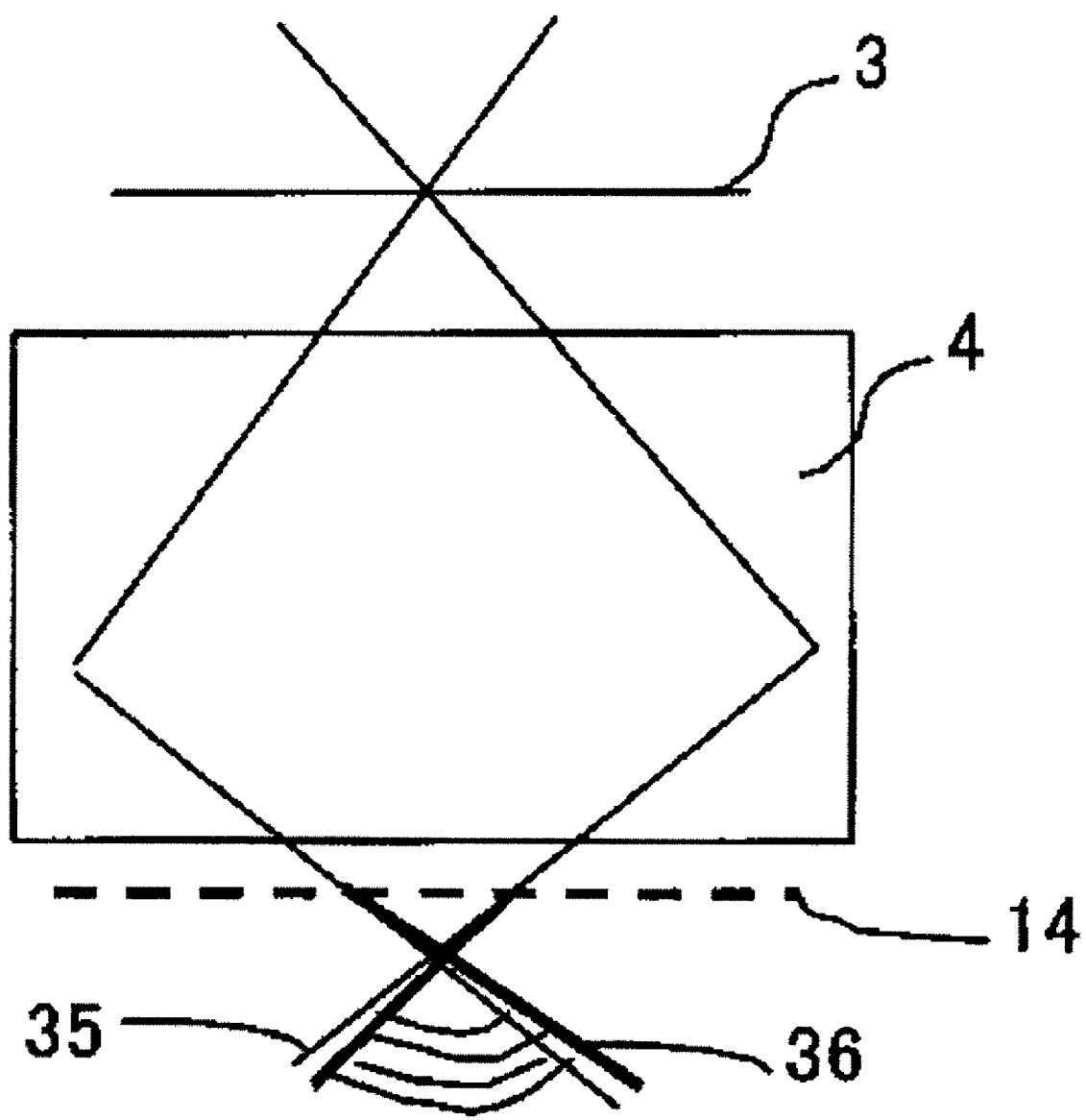
FIG. 11 is a schematic block diagram of the LSI of the exposure apparatus shown in FIG. 10.

Referring now to FIG. 10, a description will be given of the exposure apparatus that has the LSI measurement system. The illumination optical system 1 irradiates the light at an angle of a polarization direction of 0° onto the openings in the plate 3. The light that has passed the opening in the plate 3 becomes an ideal spherical wave, passes a diffraction grating 14 with wavefront information of the projection optical system 4, and reaches the detector 12 that is located at a position conjugate with the pupil in the projection optical system 4 via the relay optical system 11. The relay optical system 11 can be omitted if the detector 12 is located at the far field. In either case, the diffraction grating 14 is distant from the image-plane position, and thus the light that passes the diffraction grating 14 is diffracted and divided into two rays. FIG. 11 shows this state.

Two diffracted rays 35 and 36 hold the same wavefront information, but there is a difference between their diffraction angles. Therefore, the interference pattern between them is a differential interference pattern corresponding to its wavefront. In order to increase the contrast of the interference pattern, the rays 35 and 36, such as ±1st order diffracted rays, are configured to have the same intensity. Such interferometry is referred to as the LSI. The LSI rotates a polarization direction of the illumination to similarly repeat a measurement of an interference pattern, and performs the FFT analysis for values of plural different polarization directions and the interference patterns.

Similar to the PDI, the LSI sums up phase information of both x-polarized light and y-polarized light at each point of the interference pattern. In addition, the rays 35 and 36 are equally subject to the influence of the projection optical system 4, and thus their light intensities hold the information in the interference. Therefore, the interference pattern has the information of the centroid of the light. Since the LSI obtains the centroid information of a differential phase (wavefront inclination) different from the centroid of the phase information, the wavefront needs to be reproduced once to convert the information into the phase. The wavefront reproduction enables the information to be treated similarly. Since the wavefront reproduction from the differential wavefront cannot calculate an offset of the reproduced wavefront, one or more retardance amounts and fast axes need to be separately calculated and added.

Thus, the measurement method of this embodiment is applicable to the exposure apparatus that has the LSI measurement system.

Similar to the openings of the plate 3, the diffraction grating 14 is designed so as to maintain the polarization state.

In addition, the diffraction grating 14 needs to be designed so as to maintain the polarization state, similar to the opening of the plate 3.

Figure 12:
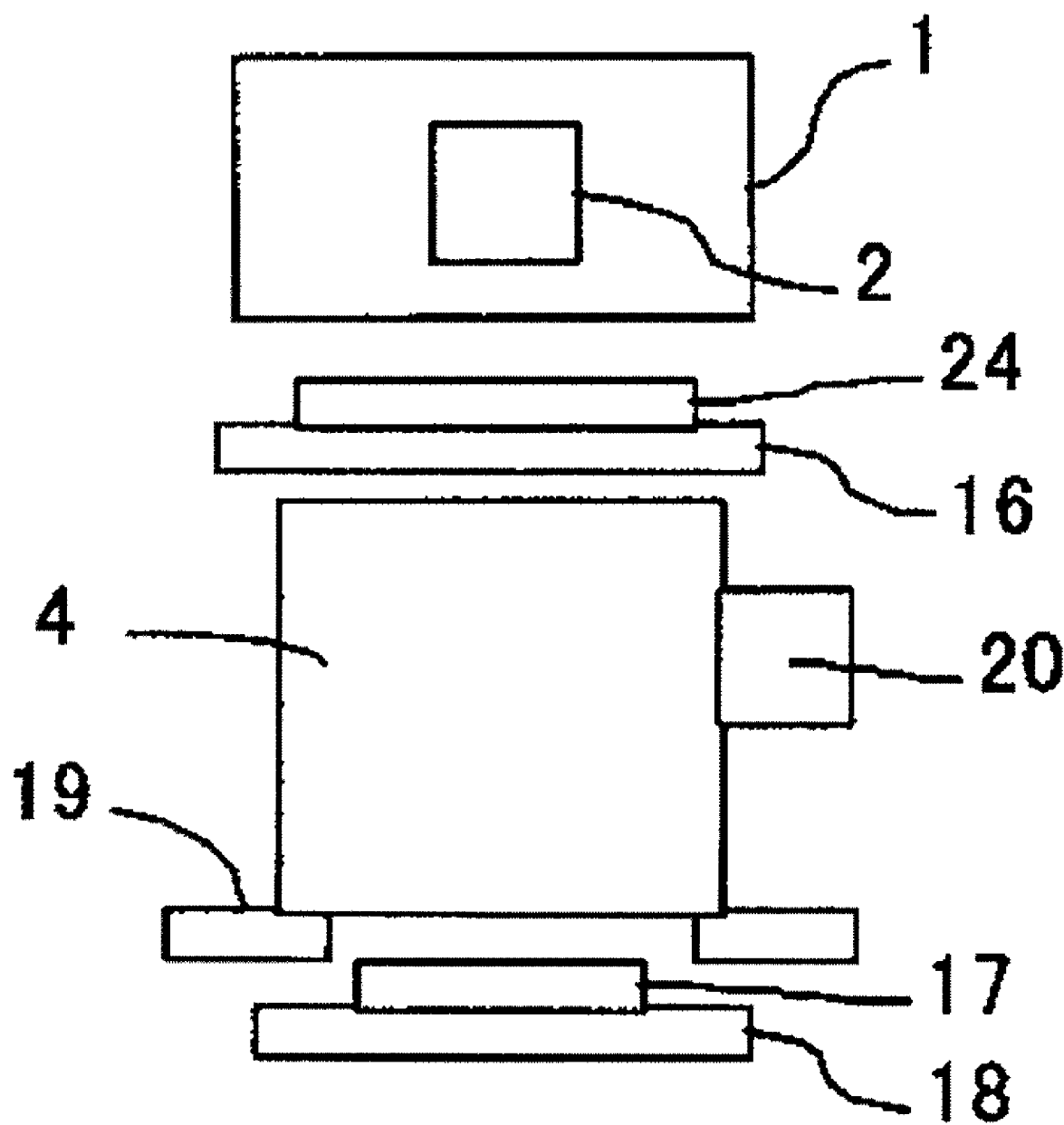
FIG. 12 is a schematic block diagram of the exposure apparatus that calculates the centroid amount of the light using the ISI lateral shift measurement method.

Referring now to FIG. 12, a description will be given of a measurement method for an exposure apparatus that has a measurement system that utilizes the Hartmann method and an ISI mask. Similar to the above embodiment, the illumination optical system 1 irradiates the linearly polarized light at a polarization direction of 0° onto an ISI mask 24.

Figure 13:
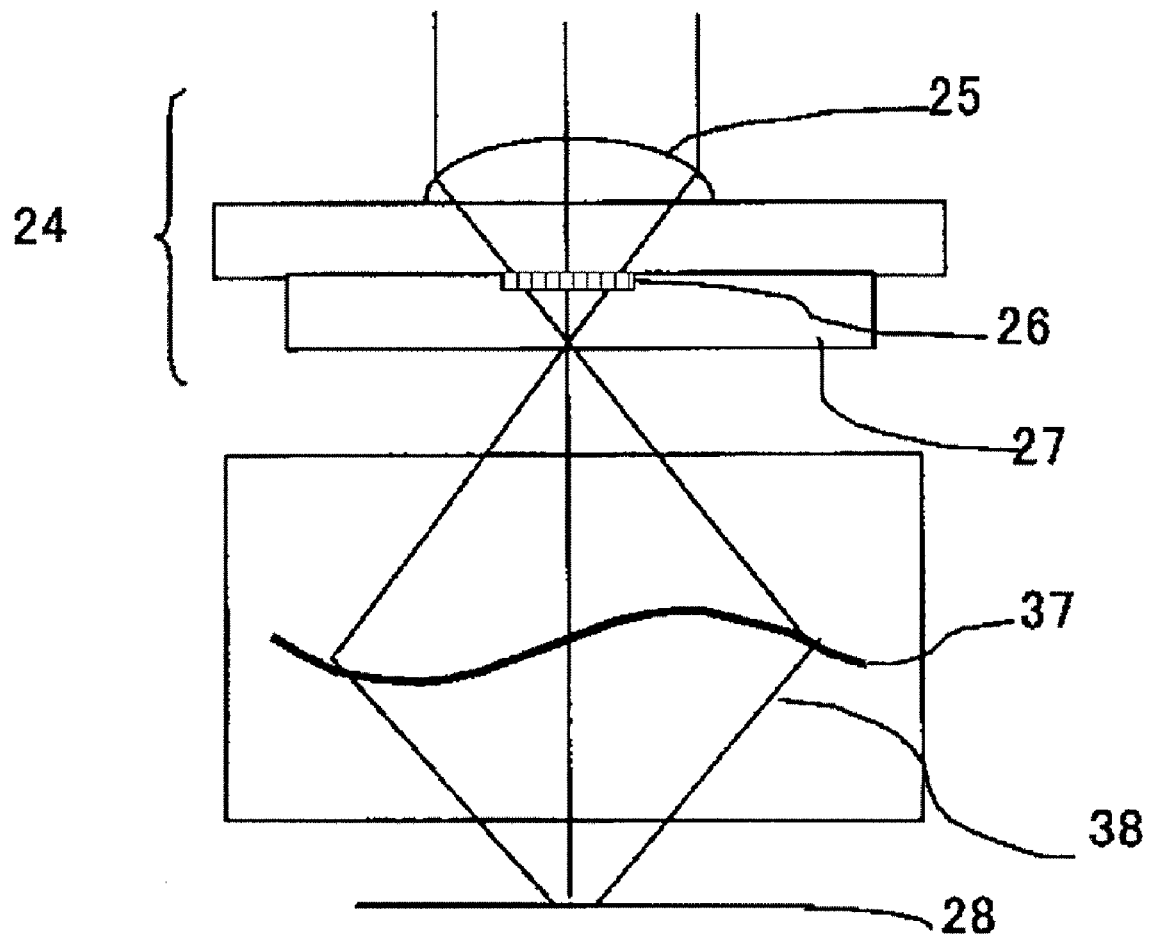
FIG. 13 is a schematic block diagram for explaining the ISI lateral shift measurement method of the exposure apparatus shown in FIG. 12.
Figure 14:
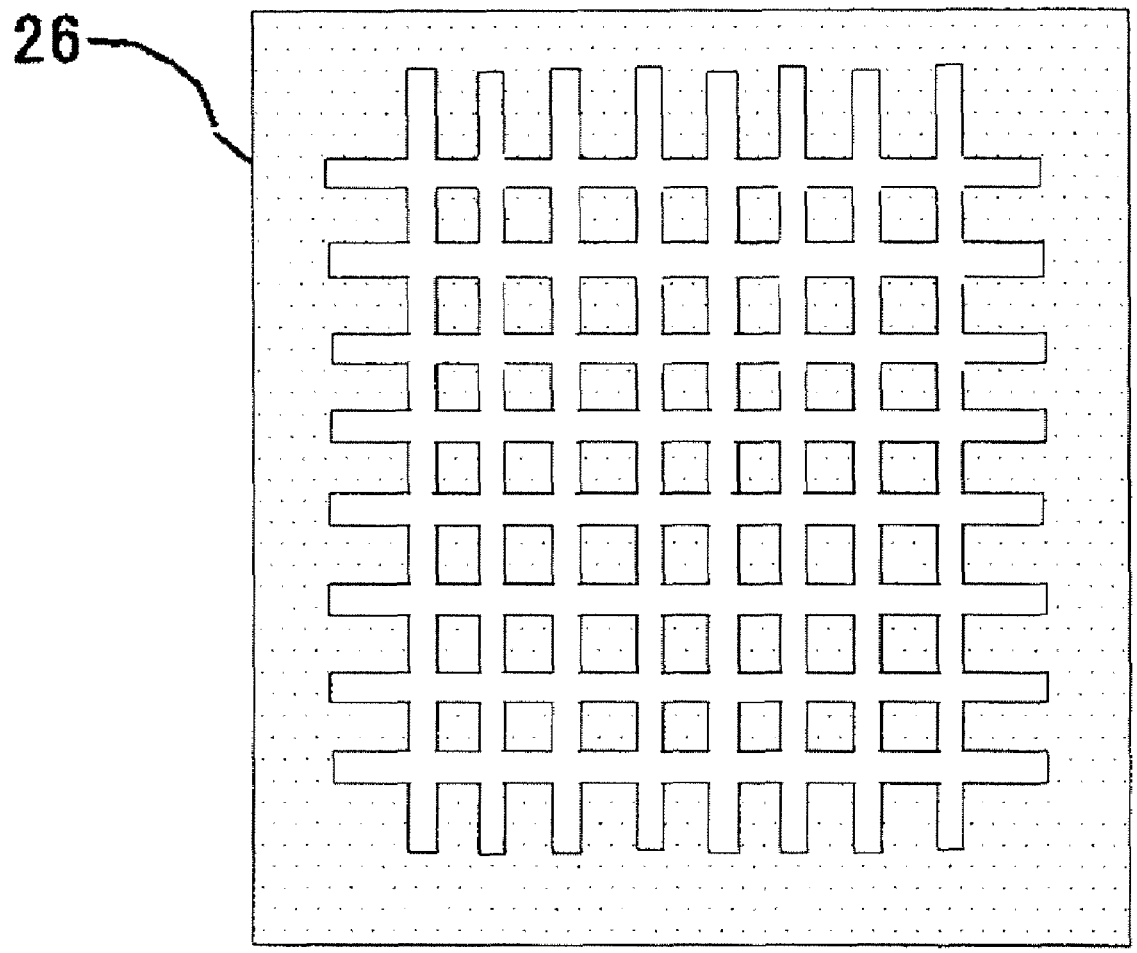
FIG. 14 is a schematic plane view of an ISI mask pattern shown in FIG. 13.
Figure 15:
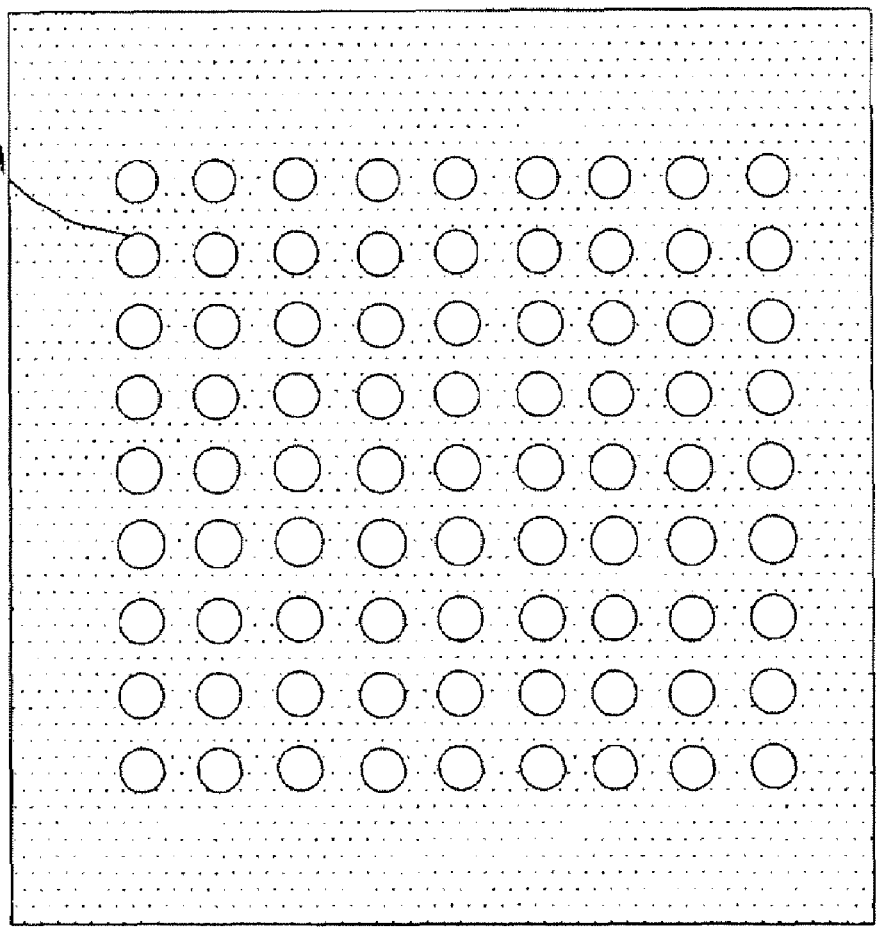
FIG. 15 is a schematic plane view showing another ISI mask pattern applicable to FIG. 13.

As shown in FIG. 13, the ISI mask 24 has a convex lens 24, a pattern 26, and a pinhole 27. A condenser optical element may be used for the convex lens 25. The pattern 26 may have a grating shape shown in FIG. 14 or a grid shape shown in FIG. 15.

The light that has passed the mask 24 passes the projection optical system 4. When the light passes the projection optical system 4, a traveling direction of a ray 38 is bent under the influence of a wavefront 37, consequently forms a lateral shift, and the ray 38 images on a wafer 28. A focus system 19, a wafer stage 18, and a wafer holder 17 can feed the wafer 28 to an image-plane position.

Figure 16:
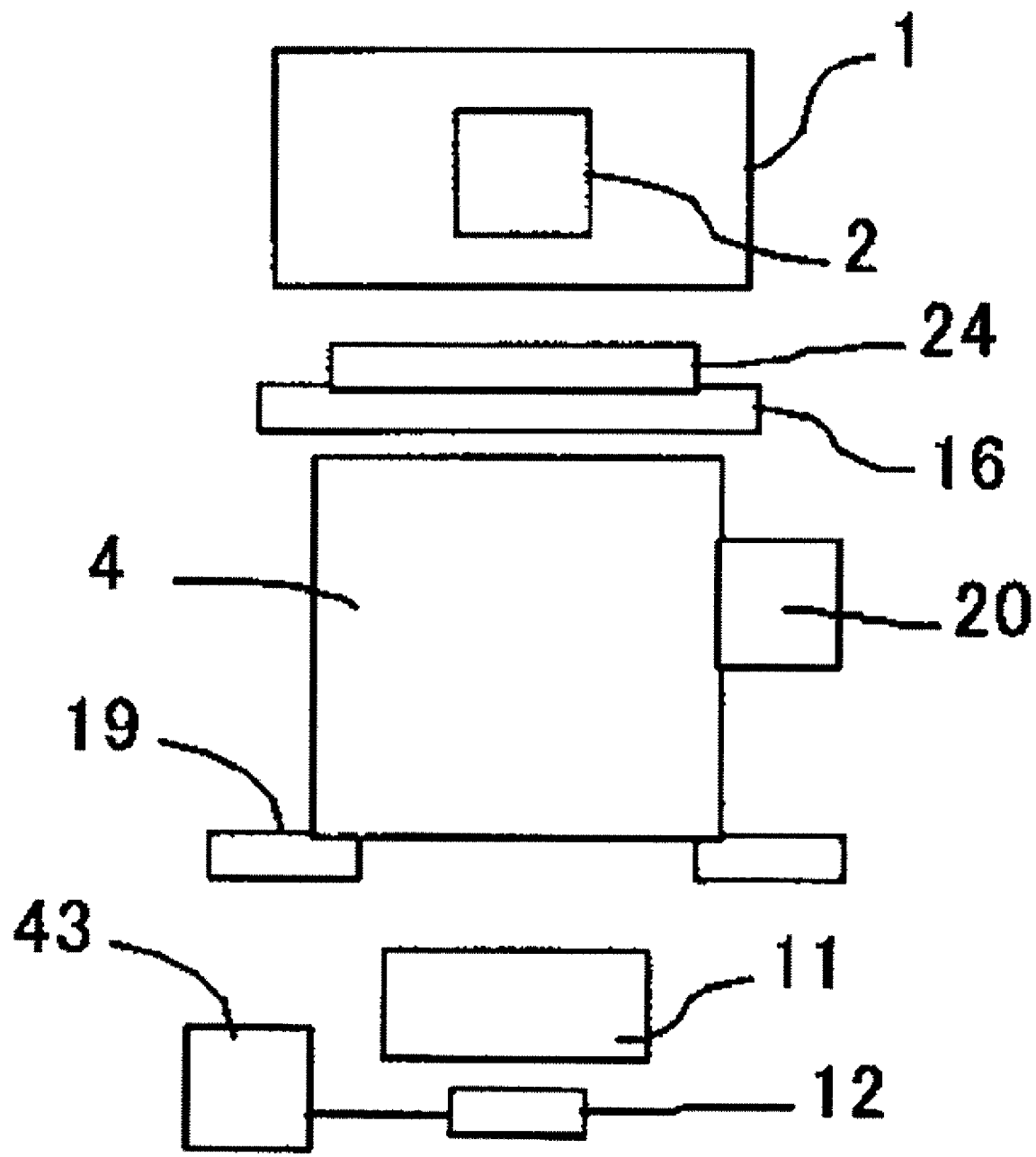
FIG. 16 is a schematic block diagram of another exposure apparatus that calculates the centroid amount of the light using the ISI lateral shift measurement method.

Similar to the previous embodiment, a positional shift may be measured, as shown in FIG. 16, by re-forming an image on the detection system 12. Next, a measurement of the lateral shift amount is repeated by rotating a polarization direction of the illumination, and this embodiment provides the FFT analysis to values of the plural different polarization directions and lateral shift amounts.

Even in this case, similar to the above embodiment, the obtained image position contains a sum of the phase information of the x-polarized light and the phase information of the y-polarized light. The ray 38 is subject to the influence of the projection optical system 4, and the light intensity of the imaged ray 38 holds the information of the influence. Thus, the image's positional shift contains the information of the centroid of the light. Since the information is the centroid information of the wavefront inclination, the wavefront needs to be reproduced once to convert the information into the phase. Thus, the measurement method of this embodiment is applicable to the exposure apparatus having the measurement system that utilizes the Hartmann method and ISI mask. The pinhole 27, convex lens 25, and similarly functioning optical elements need to be designed so as to maintain the polarization state.

Figure 19:
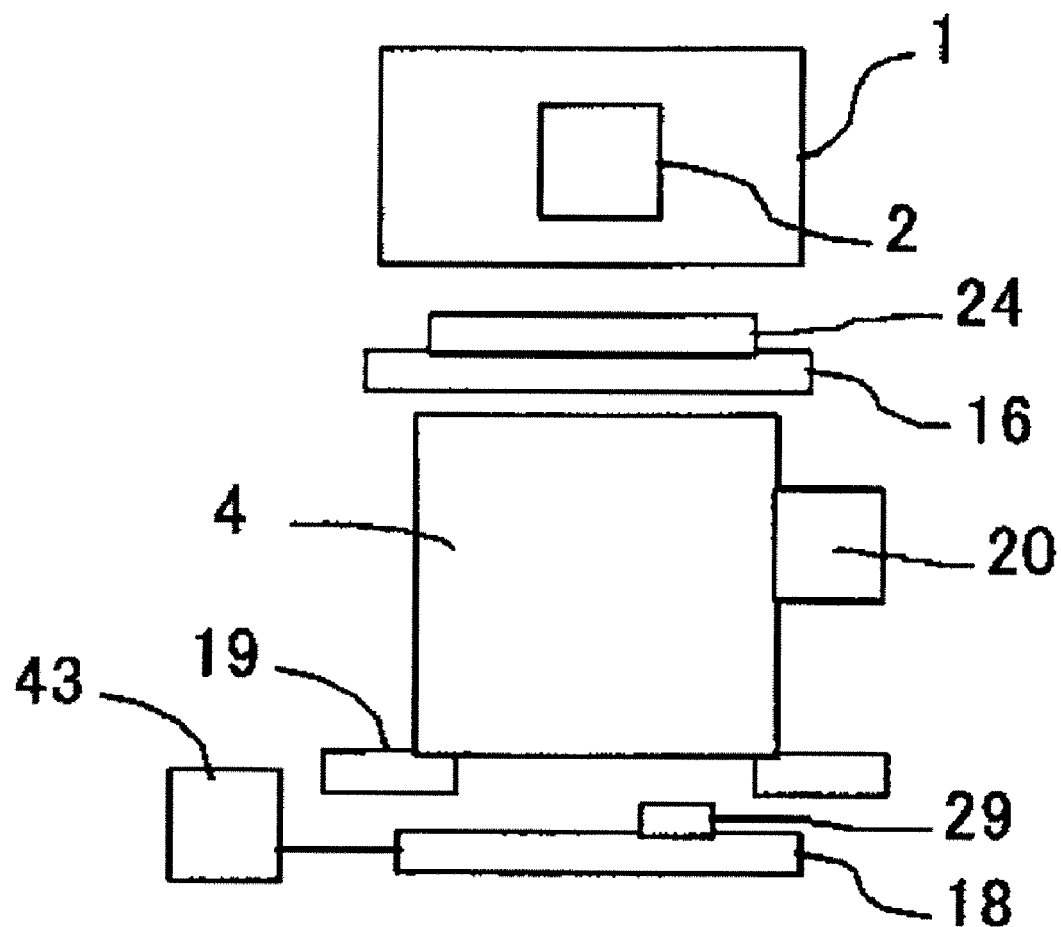
FIG. 19 is a schematic block diagram of another exposure apparatus that calculates the centroid amount of the light using the Hartmann measurement method.
Figure 20:
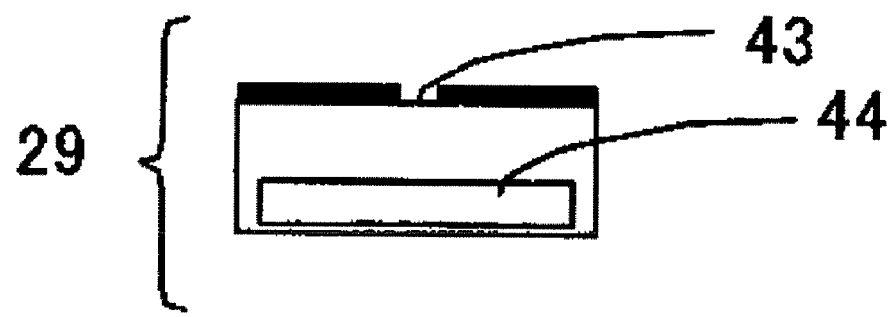
FIG. 20 is a schematic block diagram for explaining the Hartmann measurement method by the exposure apparatus shown in FIG. 19.

An alternative method arranges a detection system 29 at the image-plane position as shown in FIG. 19, and measures an aerial image and the image position shift while moving the stage 18. This method is applicable because it is similar to the above embodiment in principle. The detection system 29 has an opening 43 on the top as shown in FIG. 20, and a light quantity sensor 44 measures the light quantity that has transmitted the opening 43.

Figure 17:
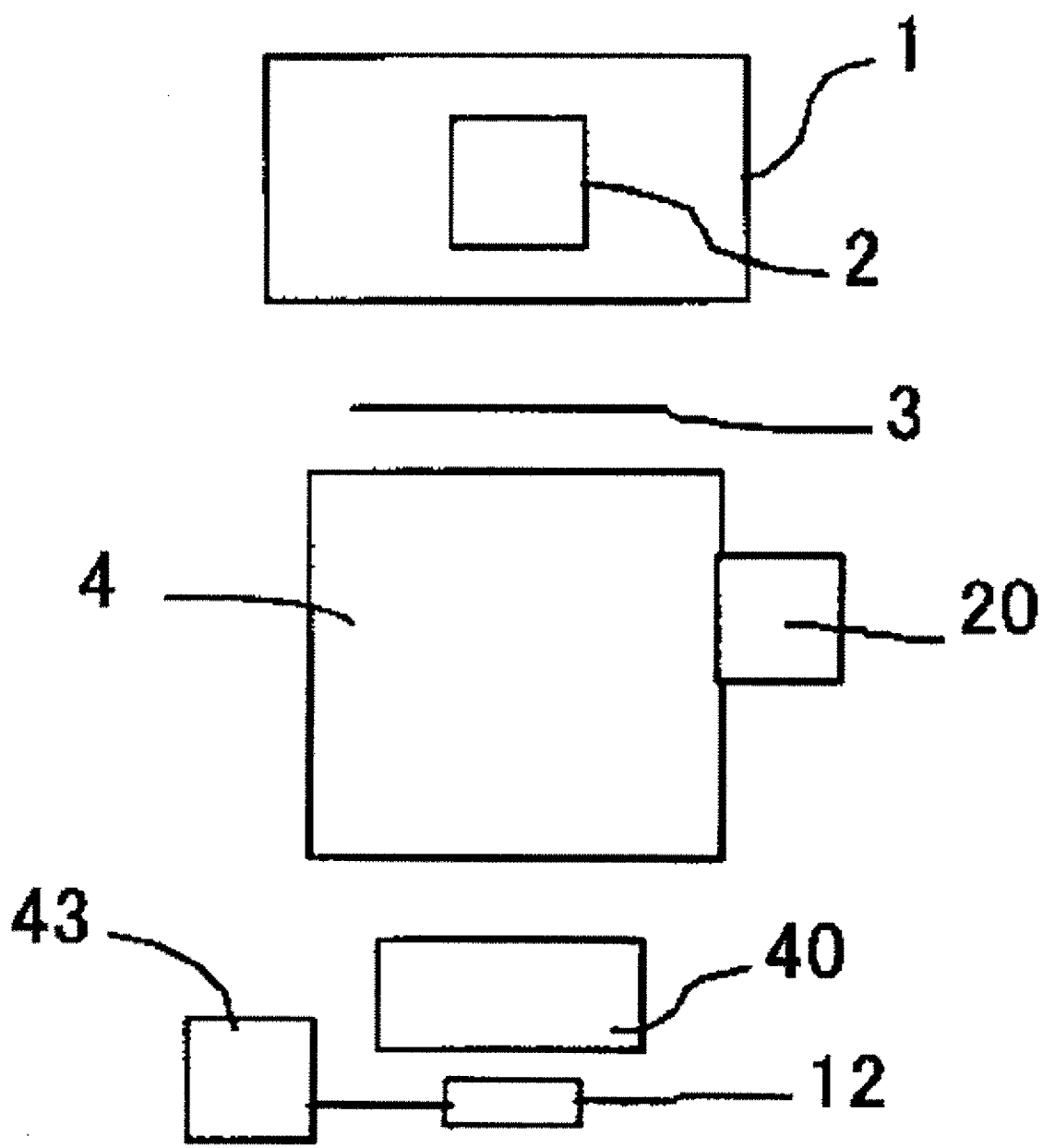
FIG. 17 is a schematic block diagram of an exposure apparatus that calculates the centroid amount of the light using the Hartmann measurement method.
Figure 18:
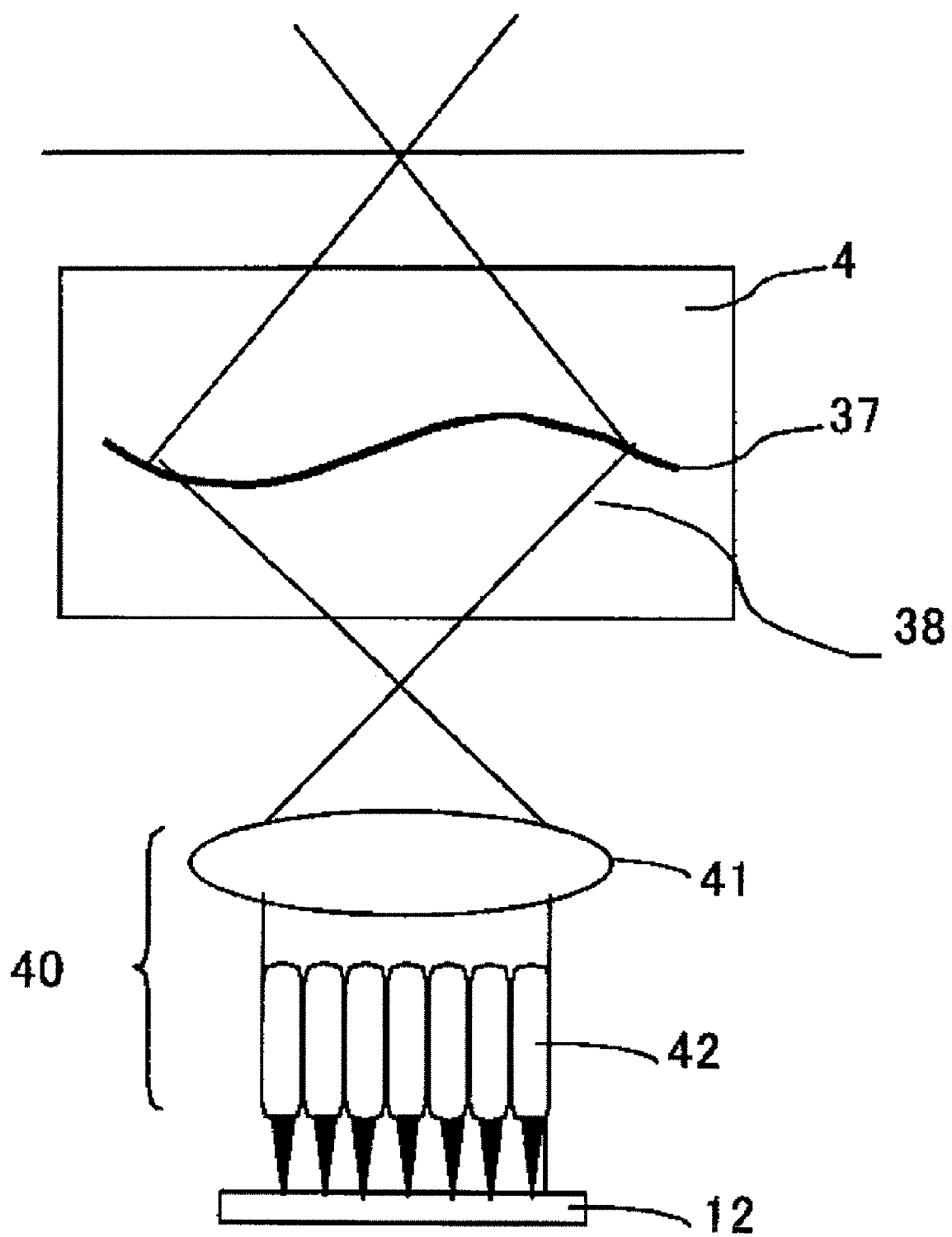
FIG. 18 is a schematic block diagram for explaining the Hartmann measurement method by the exposure apparatus shown in FIG. 17.

Referring now to FIG. 17, an exposure apparatus that has a measurement system that utilizes the Hartmann method and an array lens. Similar to the above embodiment, the illumination optical system 1 irradiates the linearly polarized light at a polarization direction of 0° onto the openings in the plate 3. The light that has passed the openings in the plate 3 becomes an ideal spherical wave, and then passes the projection optical system 4. A ray 38 subject to the influence of the wavefront 37 reaches the detection system 12 via a micro lens array 40. The ray 38 that passes the micro lens array unit 40 is collimated by a relay optical system 41 shown in FIG. 18, and led to a micro lens array 42. The micro lens array 42 discretely condenses the light on the detection system 12. A position of the detection system 12 is arranged at a position conjugate with the image plane. A discrete dot image on the detection system 12 is bent under the influence of a wavefront 37, causing a lateral shift. Next, a measurement of the lateral shift amount is repeated by rotating the polarization direction of the illumination, and this embodiment provides the FFT analysis to values of the plural polarization directions and lateral shift amounts.

Even in this case, similar to the above embodiment, the obtained image position contains a sum of the phase information of the x-polarized light and the phase information of the y-polarized light. The ray 38 is subject to the influence of the projection optical system 4, and the light intensity of the imaged ray 38 holds the information of the influence. Therefore, the image's positional shift contains the information of the centroid of the light. Since the information is the centroid information of the wavefront inclination, the wavefront needs to be reproduced once to convert the information into the phase. Thus, the measurement method of this embodiment is applicable to the exposure apparatus that has the measurement system that utilizes the Hartmann method and array lens.

Figure 21:
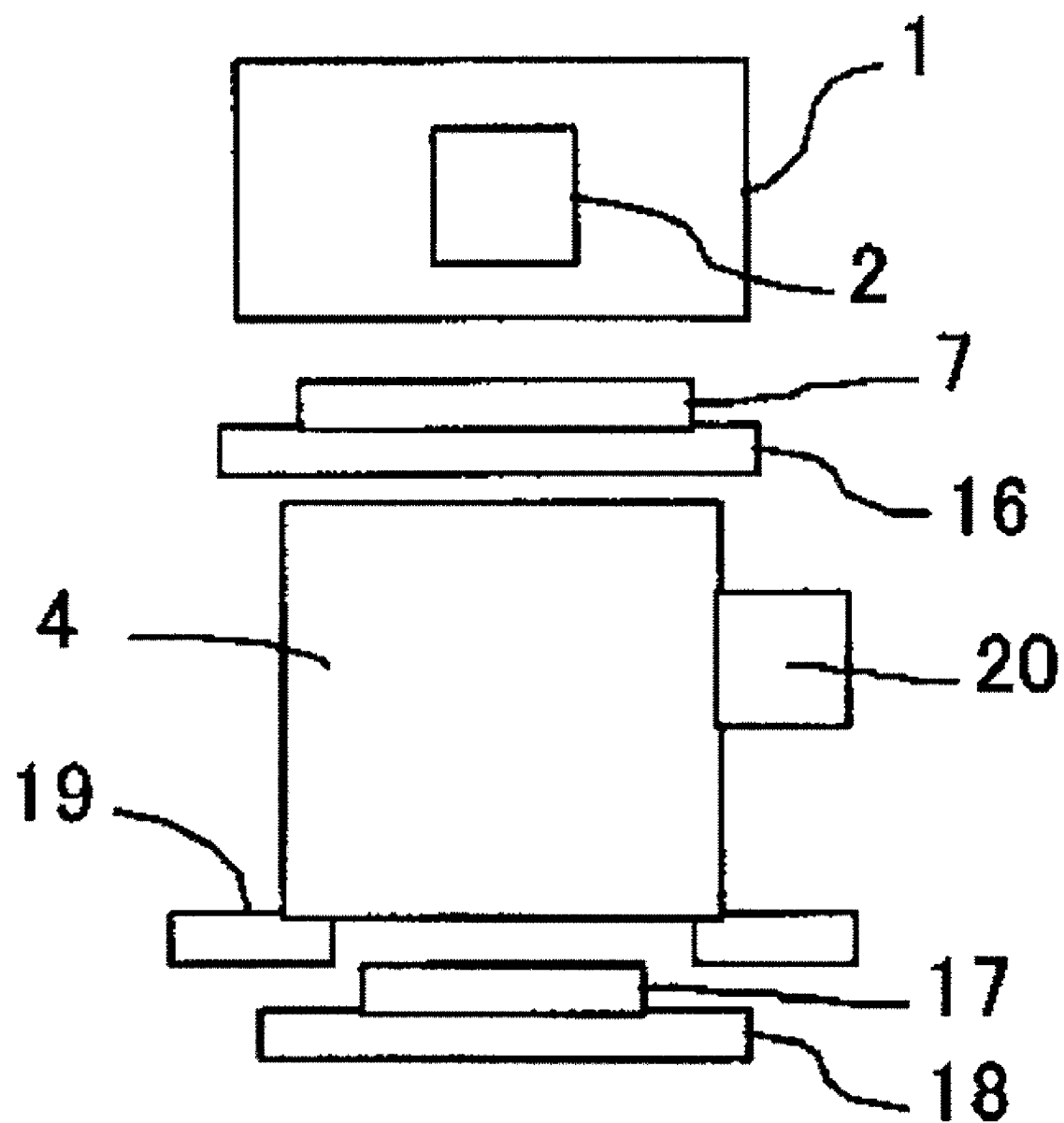
FIG. 21 is a schematic block diagram of an exposure apparatus that calculates the centroid amount of the light using the SPIN measurement method.
Figure 22:
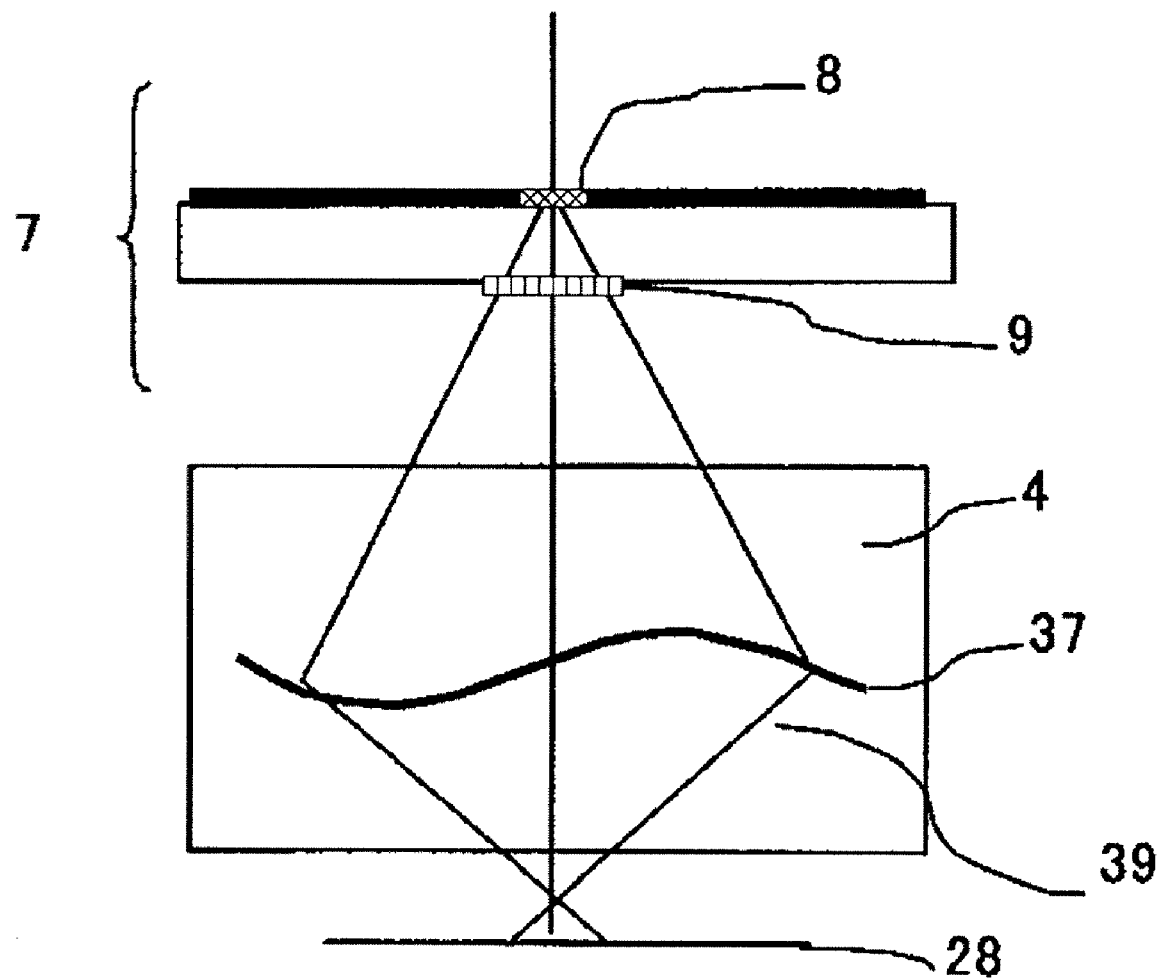
FIG. 22 is a schematic block diagram for explaining the SPIN measurement method of the exposure apparatus shown in FIG. 21.
Figure 23:
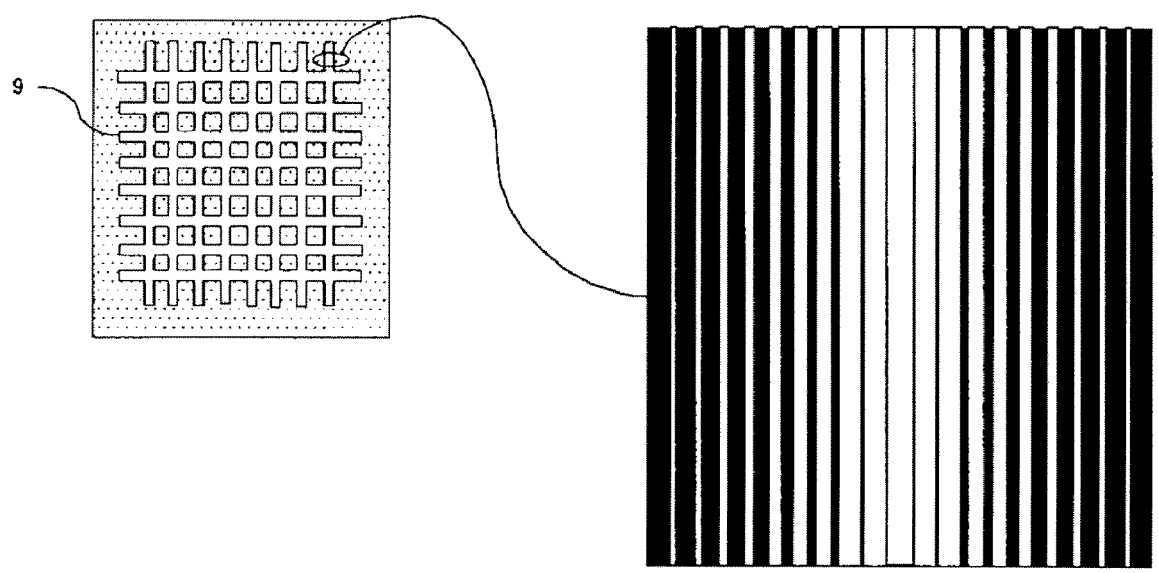
FIG. 23 is a schematic plane view of a measured mark shown in FIG. 21.

Referring now to FIG. 21, an exposure apparatus that has a measurement system that utilizes the Hartmann method and a SPIN mask 7. Similar to the above embodiment, the illumination optical system 1 irradiates the linearly polarized light at a polarization direction of 0° onto the SPIN mask 7 that includes a diffusion optical system 8 and a pattern 9 as shown in FIG. 22. The pattern 9 has a grid shape as shown in FIG. 23, and each line has a special pattern that restrains the diffraction light, referred to as a Yamato mark. The light that has passed the SPIN mask 7 passes the projection optical system 4. When the light passes the projection optical system 4, it is subject to the influence of a wavefront 37. Thus, a traveling direction of the ray 38 is bent, consequently forms a lateral shift, and the ray 38 images on the wafer 28. A photosensitive material is applied to the wafer 28, and a lateral shift from an image of the pattern 9 is measured through a development and a latent image. The focus system 19, the wafer stage 18, and the wafer holder 17 can feed the wafer 28 to the image-plane position.

Next, a measurement of the lateral shift amount is repeated by rotating the polarization direction of the illumination, and this embodiment provides the FFT analysis to values of the plural polarization directions and lateral shift amounts. Even in this case, similar to the above embodiment, the obtained image position contains a sum of the phase information of the x-polarized light and the phase information of the y-polarized light. The ray 38 is subject to the influence of the projection optical system 4, and the light intensity of the imaged ray 38 holds the information of the influence. Therefore, the image's positional shift contains the information of the centroid of the light. Since the information is the centroid information of the wavefront inclination, the wavefront needs to be reproduced once to convert the information into the phase. Since the wavefront reproduction from the differential wavefront cannot enable an offset of the reproduced wavefront to be calculated, one or more retardance amounts and fast axes need to be separately measured and added.

Thus, the measurement method of this embodiment is applicable to the exposure apparatus that has the measurement system that utilizes the Hartmann method and the SPIN mask.

The diffusion optical system 8 and Yamato pattern 9 are designed to maintain the polarization state.

Figures 24A, 24B:
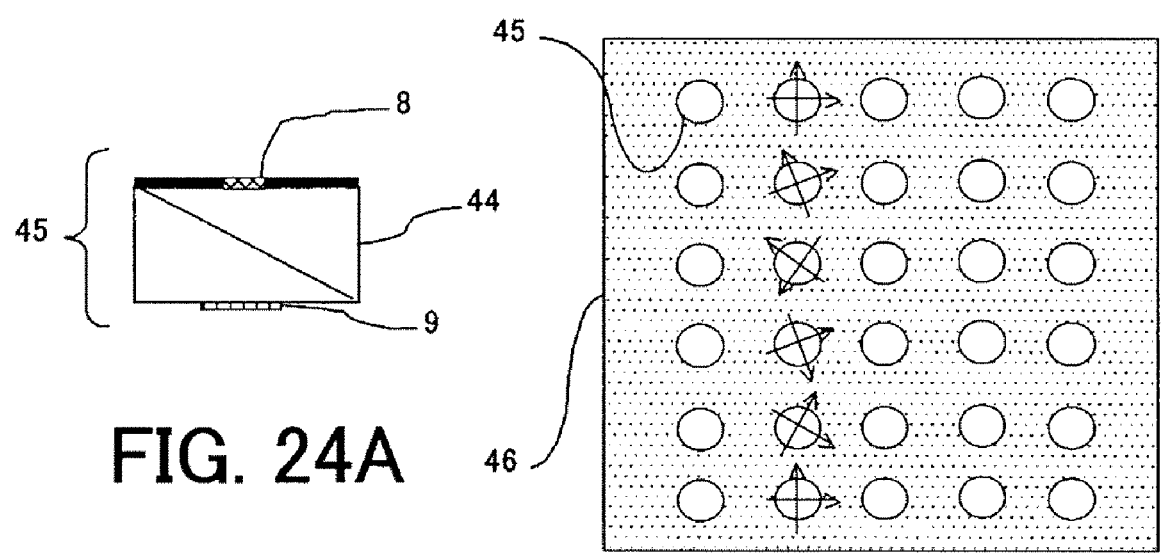
FIGS. 24A and 24B are sectional and plane views showing an illustrative application of FIG. 22.

Another illustrative application arranges plural polarization modules 45 as if they are formed in a mask 46, as shown in FIGS. 24A and 24B. Each polarization module 45 has the opening of the diffusion optical element 8 on the polarizer 44 and the pattern (Yamato mark) 9 under the polarizer 44. FIGS. 24A and 24B are schematic sectional views of each polarization module 45.

Figure 25A:
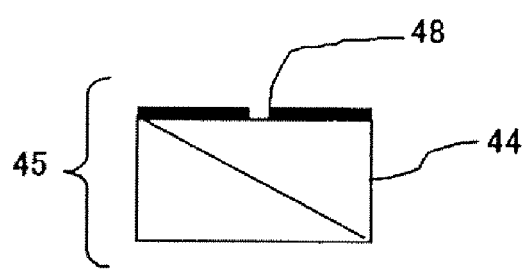
FIGS. 25A and 25B are schematic sectional views of a structure of the mask shown in FIGS. 24A and 24B applicable to the LSI lateral measurement method or another method.
Figure 25B:
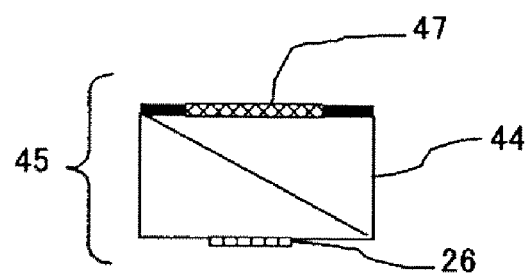

The principal axis of the polarizer 44 in each polarization module 45 has been slightly rotated. As a result, this embodiment can also measure different polarization states when the illumination optical system 1 irradiates proper light even without the polarization unit 2. The structure of the module 45 is applicable to the openings in the plate 3 by changing the top opening in the diffusion optical element 8 and the bottom pattern 9, whether the measurement method is the SPIN method, the ISI method or another interferometry. FIGS. 25A and 25B illustrate this embodiment. The instant measurement method is as discussed above, which utilizes the PDI, LSI, and various types of Hartmann methods using the mask and measurement optical element shown in FIGS. 24A and 24B.

Figure 26:
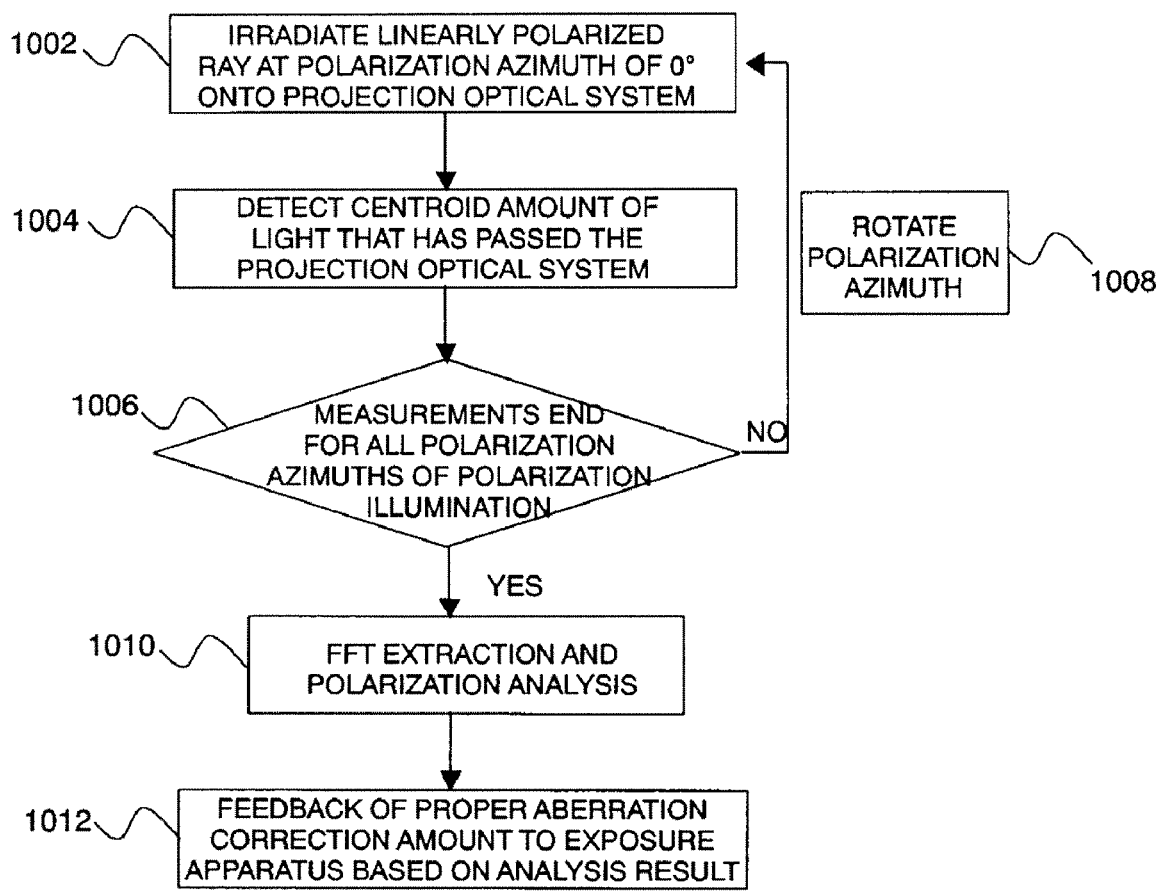
FIG. 26 is a flowchart for explaining a measurement method according to this embodiment.

Referring now to the measurement sequence flow shown in FIG. 26, an exposure apparatus that can optimize the polarization state under the polarization illumination exposure condition. The illumination optical system 1 irradiates the linearly polarized light at the polarization direction of 0° (step 1002). Next, the centroid amount of the light that has passed the projection optical system 4 is measured through one of the above measurement methods, and stored in a data processing system 43 (step 1004). Next, the polarization unit 2 is rotated to repeat a measurement with an illumination having a different polarization direction and storage of the result for all the set polarization directions (steps 1006 and 1008). Using the stored measurement results and values of the corresponding polarization directions, the data processing system 43 analyzes the polarization characteristic and calculates the optimal projection optical system 4, reticle pattern, and correction amount of the illumination optical system 1 (step 1010). The calculation of the correction amount can use a method disclosed in Japanese Patent Application No. 11-054411. Thereafter, the correction amount is fed back to the exposure apparatus (step 1012). The feedback can be implemented by the lens driving system 20, and a polarization controller (not shown) of the illumination optical system 1 that controls the polarization illumination.

Figure 28:
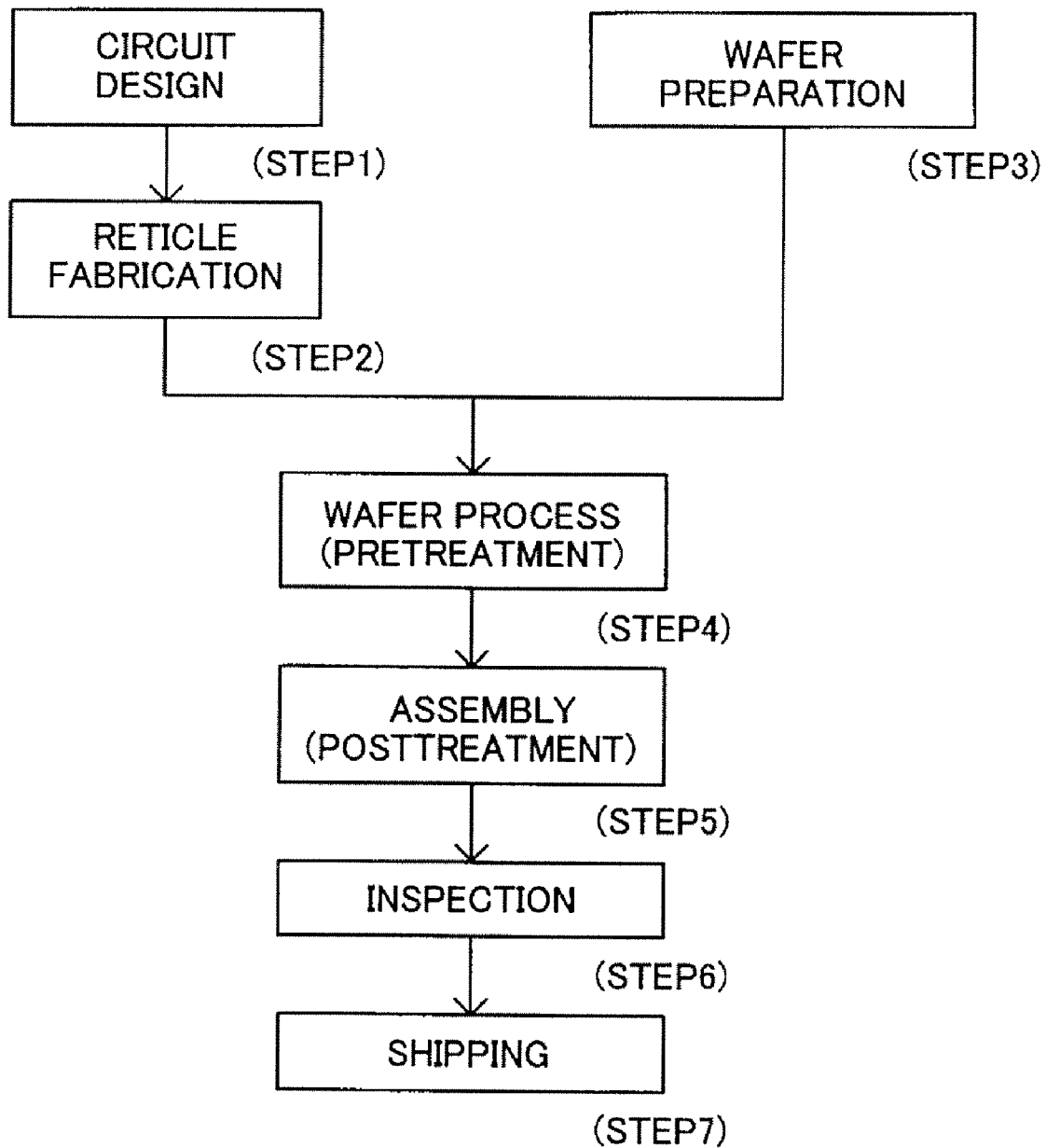
FIG. 28 is a flowchart for explaining manufacture of a device.
Figure 29:
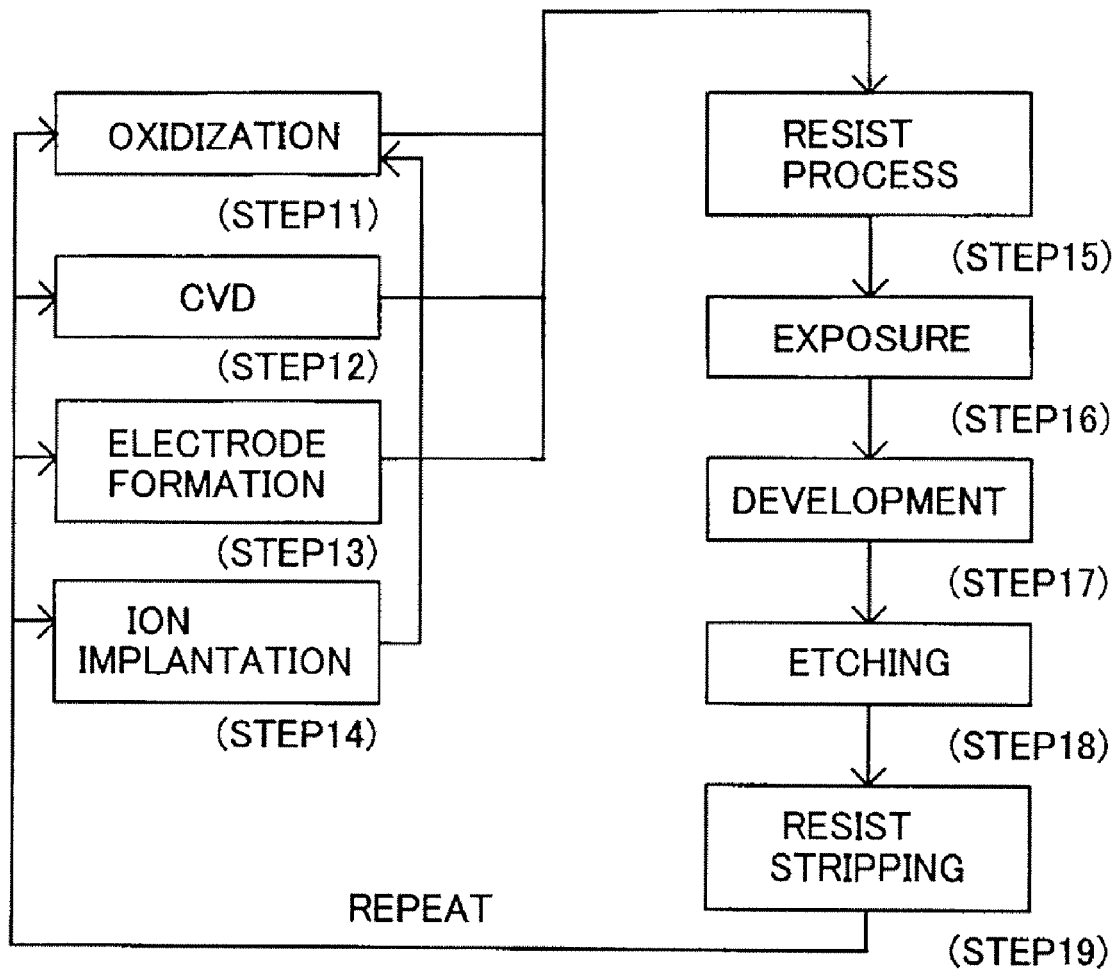
FIG. 29 is a detailed flowchart of a wafer process of step 4 shown in FIG. 28.

Referring now to FIGS. 28 and 29, a description will now be given of an embodiment of a device manufacturing method that utilizes the above exposure apparatus. FIG. 28 is a flowchart for manufacturing fine devices, such as a semiconductor device and a liquid crystal display device. This embodiment describes an illustration of the manufacture of the semiconductor device. Step 1 (circuit design) designs a device circuit. Step 2 (reticle fabrication) forms a reticle having a designed circuit pattern. Step 3 (wafer preparation) manufactures a wafer using a material such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 29 is a detailed flow of the wafer process of step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus to expose the reticle's circuit pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture devices of higher quality than ever. Thus, the device manufacturing method that uses the exposure apparatus, and resultant devices constitute one aspect of the present invention.

Furthermore, the present invention is not limited to these preferred embodiments and various variations and modifications may be made without departing from the scope of the present invention.

This application claims foreign priority benefits based on Japanese Patent Application No. 2006-017561, filed on Jan. 26, 2006, which is hereby incorporated by reference herein in its entirety as if fully set forth herein.

What is claimed is:

1. A method for irradiating onto a target optical system plural linearly polarized rays having different polarization directions, and for measuring a polarization characteristic of the target optical system including a birefringence amount R and a fast axis Φ, said method comprising the steps of:

irradiating linearly polarized ray having a polarization direction θ onto the target optical system and obtaining a centroid amount P of the ray that has transmitted through the target optical system; and obtaining the birefringence amount R and the fast axis Φ from P=−R·cos(2θ−Φ) or P=R·cos(2θ−Φ).

2. A method according to claim 1, wherein the polarization characteristic further includes a Jones matrix M defined in the following equation, and said method further comprising the step of obtaining the Jones matrix M by irradiating two linearly polarized rays having different polarization directions onto the target optical system and measuring transmittances A and A' of the target optical system for the two linearly polarized rays:

$M = [A \cdot \exp(-i \cdot m), a \cdot \exp(-i \cdot b); a \cdot \exp(-i \cdot b), A' \cdot \exp(i \cdot m)]$ $a = 2A'' \cdot \sin R \cdot Ex \cdot Ey,$ $A'' = (A+A')/2,$ $b \pm \pi/2,$ $m = Arg\{A \cdot Ey^2 \cdot \exp(-i \cdot R) + A' \cdot Ex^2 \cdot \exp(i \cdot R)\},$ $Ex = \sqrt{\{(1+\cos \Phi)2\}},$ $Ex^2 + Ey^2 = 1.$ 3. A method for irradiating onto a target optical system plural linearly polarized rays having different polarization directions, and for measuring a polarization characteristic of the target optical system, said method comprising the steps of:

obtaining a relationship between an actual value of the polarization characteristic of the target optical system and a value of the polarization characteristic obtained under an approximation of an eigenvector of a Jones matrix of the target optical system to a linearly polarized ray;

obtaining a centroid amount determined by light intensities and phases of two rays divided due to birefringence of the target optical system; and calculating the polarization characteristic based on the relationship and the centroid amount of the rays.

4. A method according to claim 3, wherein the relationship is a proportion.

5. A method according to claim 3, wherein the target optical system includes plural lenses, and a distribution range of the birefringence amount falls within 30°.

6. A method according to claim 3, further comprising the step of changing the polarization direction of the ray.

7. A method according to claim 3, wherein said centroid obtaining step utilizes a point diffraction interferometry, a lateral shearing interferometry, or Hartmann method.

8. An exposure apparatus comprising a projection optical system for projecting a reticle pattern onto a substrate, the projection optical system being adjusted based on a polarization characteristic measured by a method that irradiates onto the projection optical system plural linearly polarized rays having different polarization directions, the polarization characteristic including a birefringence amount R and a fast axis Φ of the target optical system, the method including the steps of irradiating the linearly polarized ray having a polarization direction θ onto the target optical system and obtaining a centroid amount P of the ray that has transmitted through the target optical system, and obtaining the birefringence amount R and the fast axis Φ from P=−R·cos(2θ−Φ) or P=R·cos(2θ−Φ).

9. A device manufacturing method comprising the steps of:

exposing a substrate using an exposure apparatus; and developing the substrate exposed, wherein the exposure apparatus includes a projection optical system for projecting a reticle pattern onto a substrate, the projection optical system being adjusted based on a polarization characteristic measured by a measurement method that irradiates onto the projection optical system plural linearly polarized rays having different polarization directions, the polarization characteristic including a birefringence amount R and a fast axis Φ of the target optical system, the measurement method including the steps of irradiating the linearly polarized ray having a polarization direction θ onto the target optical system and obtaining a centroid amount P of the ray that has transmitted through the target optical system, and obtaining the birefringence amount R and the fast axis Φ from P=−R·cos(2θ−Φ) or P=R·cos(2θ−Φ).

* * * * *